(12) United States Patent
Iba

(10) Patent No.: US 8,008,197 B2
(45) Date of Patent: Aug. 30, 2011

(54) METHOD FOR MANUFACTURING SEMICONDUCTOR DEVICE

(75) Inventor: Yoshihisa Iba, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 76 days.

(21) Appl. No.: 12/492,368

(22) Filed: Jun. 26, 2009

(65) Prior Publication Data
US 2010/0003820 A1    Jan. 7, 2010

(30) Foreign Application Priority Data
Jul. 2, 2008   (JP) .................. 2008-173221

(51) Int. Cl.
*H01L 21/44* (2006.01)
(52) U.S. Cl. ................. 438/675; 257/E21.577
(58) Field of Classification Search .............. 438/675, 438/629, 637, 640; 257/E21.577
See application file for complete search history.

(56) References Cited

U.S. PATENT DOCUMENTS

| 7,622,808 | B2* | 11/2009 | Ohtake et al. ................. 257/760 |
| 7,772,112 | B2* | 8/2010 | Iba ................................. 438/637 |
| 2004/0106293 | A1 | 6/2004 | Igarashi |
| 2004/0198037 | A1* | 10/2004 | Iba .................................. 438/634 |
| 2005/0205519 | A1 | 9/2005 | Kim et al. |
| 2006/0186548 | A1* | 8/2006 | Enomoto et al. .............. 257/758 |
| 2008/0020570 | A1* | 1/2008 | Naik ............................. 438/675 |

FOREIGN PATENT DOCUMENTS

| JP | 2002-270586 A | 9/2002 |
| JP | 2007-529905 A | 10/2007 |
| WO | 2005-091974 A2 | 10/2005 |

* cited by examiner

*Primary Examiner* — Matthew Smith
*Assistant Examiner* — Christine Enad
(74) *Attorney, Agent, or Firm* — Westerman, Hattori, Daniels & Adrian, LLP

(57) ABSTRACT

A method for manufacturing a semiconductor device includes forming in order a barrier film, an insulating film, a first mask, and a second mask having etching properties different from those of the first mask on a substrate, removing the insulating film, the first mask, and the second mask to form a via hole in the insulating film, removing the second mask in a wiring trench forming region including the via hole, and etching the first mask using the second mask as a mask to remove the first mask in the wiring trench forming region. Removing the first mask in the wiring trench forming region includes etching the first mask and etching the barrier film at the bottom of the via hole to partially remove the barrier film at the bottom of the via hole.

12 Claims, 21 Drawing Sheets

METHOD FOR MANUFACTURING SEMICONDUCTOR DEVICE

CROSS-REFERENCES TO RELATED APPLICATIONS

This application is based upon and claims the benefit of priority of the prior Japanese Patent Application No. 2008-173221, filed on Jul. 2, 2008, the entire contents of which are incorporated herein by reference.

FIELD

The present invention relates to a method for manufacturing a semiconductor device.

BACKGROUND

A process for forming a wiring layer in a semiconductor device uses a so-called damascene process including forming a groove pattern and hole pattern in an interlayer insulating film and then filling groove and holes with a wiring material. The damascene process is classified into a single damascene process in which via hole filling and wiring trench filling are performed separately, and a dual damascene process in which via hole filling and wiring trench filling are performed simultaneously.

Recently, low-dielectric films (low-k films) have been used as interlayer insulating films in which a wiring layer is buried to increase the speeds of semiconductor devices.

SUMMARY

According to aspects of an embodiment, a method for manufacturing a semiconductor device includes: forming in order a barrier film, an insulating film, a first mask, and a second mask having etching properties different from those of the first mask on a substrate; removing the insulating film, the first mask, and the second mask to form a via hole in the insulating film; removing the second mask in a wiring trench forming region including the via hole; and etching the first mask using the second mask as a mask to remove the first mask in the wiring trench forming region. Removing the first mask in the wiring trench forming region includes etching the first mask and etching the barrier film at the bottom of the via hole to partially remove the barrier film at the bottom of the via hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As the dielectric constant of an interlayer insulating film decreases, the etching rate of the interlayer insulating film increases, and the etching selection ratio of the interlayer insulating film to a barrier film at the bottom of a via hole increases regardless of the etching gas used. As a result, it is difficult to form a wiring trench having a design depth in the interlayer insulating film, or an open defect occurs at the bottom of a via hole.

As a wiring forming method by a dual damascene process, a wiring forming method using a two-layer structure hard mask has been proposed. The proposed wiring forming method by a dual damascene process is described with reference to FIGS. 10A to 10L. FIGS. 10A to 10L are sectional views depicting the proposed wiring forming method by a damascene process using a two-layer structure hard mask.

Figure 1A:
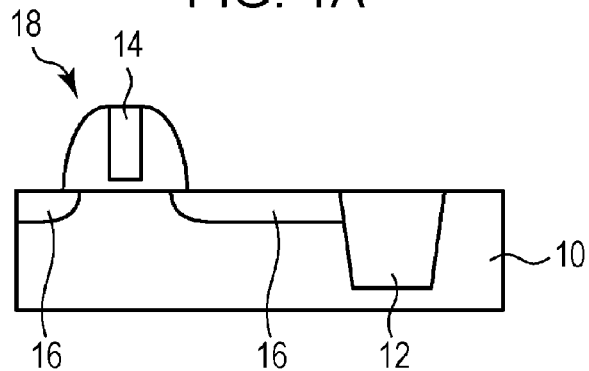
FIGS. 1A to 1O are sectional views depicting a method for manufacturing a semiconductor device according to an embodiment.

First, a barrier film 104, a low-dielectric film 106, a first hard mask 108, and a second hard mask 110 are formed in order on an interlayer insulating film 100 in which a wiring layer 102 is buried by, for example, a CVD method or the like (FIG. 1A).

Then, a bottom anti-reflective coating (BARC) film 112 is formed as an antireflection film on the second hard mask 110.

Figure 10A:
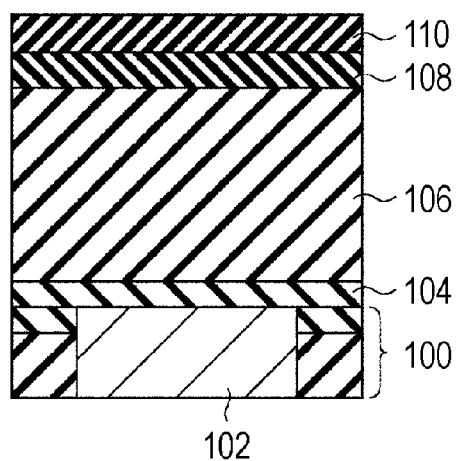
FIGS. 10A to 10L are sectional views depicting a wiring forming method by a proposed dual damascene process.
Figure 10B:
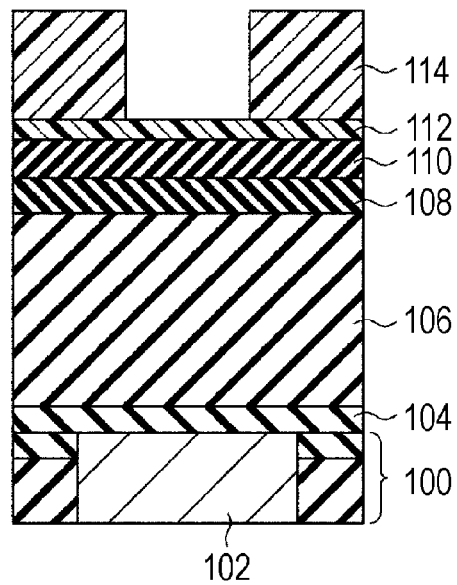

Next, a photoresist film 114 used for exposing a via hole forming region is formed on the BARC film 112 by photolithography (FIG. 10B).

Next, the second hard mask 110, the first hard mask 108, and the low-dielectric film 106 are dry-etched using the photoresist film 114 as a mask and the barrier film 104 as a stopper. As a result, a via hole 116 is formed in the second hard mask 110, the first hard mask 108, and the low-dielectric film 106.

Figure 10C:
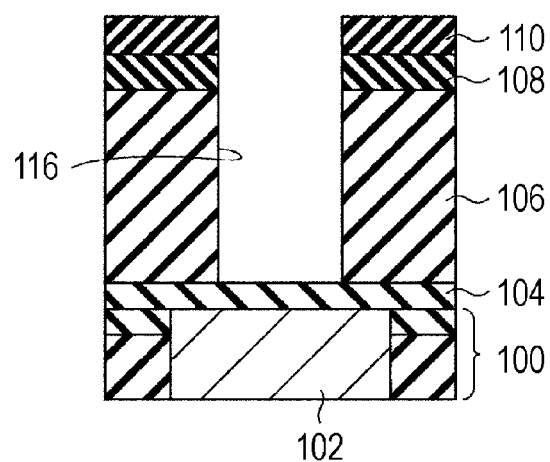

Next, the photoresist film 114 and the BARC film 112 are removed by, for example, ashing (FIG. 10C).

Next, a resin material such as photoresist or the like is applied over the entire surface, cured, and then etched back. As a result, the via hole 116 is filled with the resin material as a buried material 118, and the surface is planarized.

Then, a BARC film 120 is formed as an antireflection film on the second hard mask 110 in which the buried material 118 is buried.

Figure 10D:
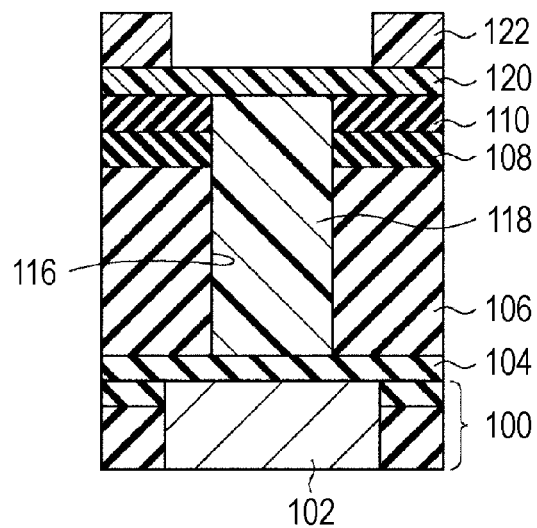

Next, a photoresist film 122 used for exposing a wiring trench forming region is formed on the BARC film 120 by photolithography (FIG. 10D).

Figure 10E:
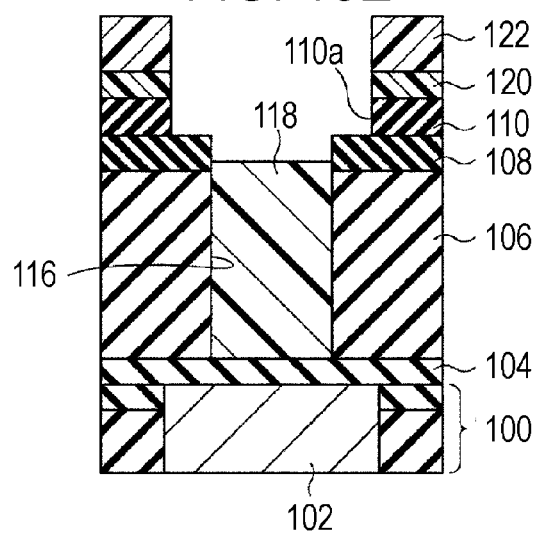

Next, the BARC film 120 and the second hard mask 110 are dry-etched using the photoresist film 122 as a mask. As a result, an aperture 110a is formed in the second hard mask 110 to expose the wiring trench forming region (FIG. 10E).

Figure 10F:
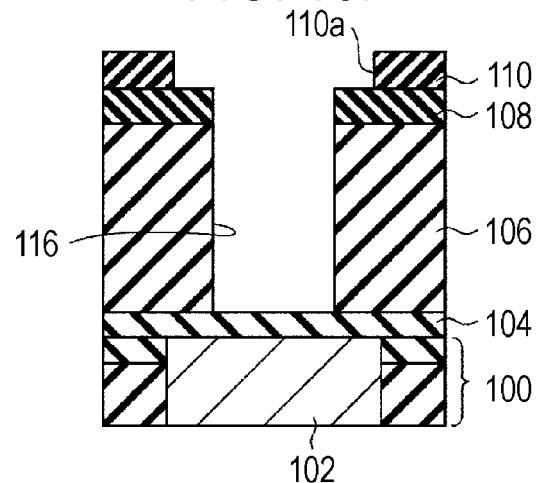

Next, the photoresist film 122, the BARC film 120, and the buried material 118 are removed by, for example, ashing (FIG. 10F).

Figure 10G:
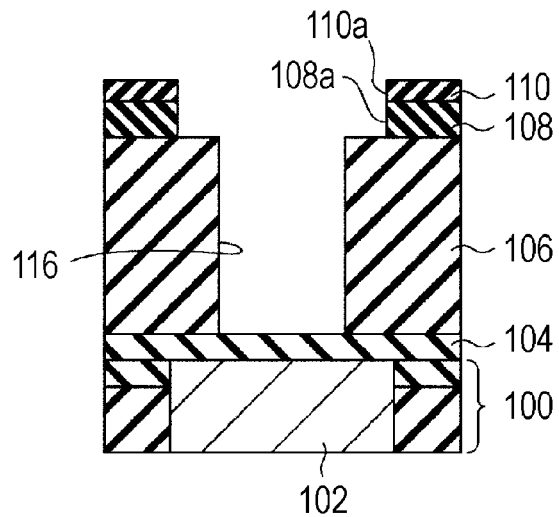

Next, the first hard mask 108 is dry-etched using the second hard mask 110 in which the aperture 110a is formed as a mask. Consequently, an aperture 108a is formed in the first hard mask 108 to expose the wiring trench forming region (FIG. 10G).

Figure 10H:
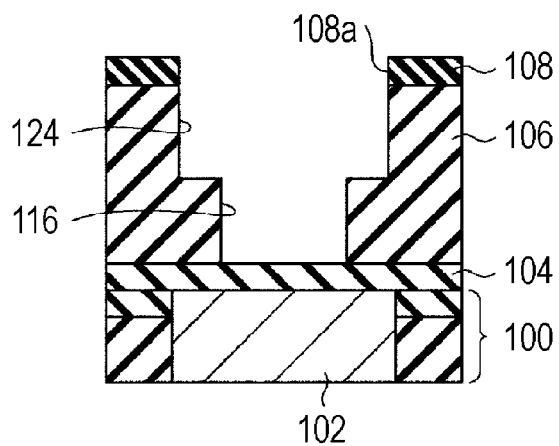

Then, the low-dielectric film 106 is dry-etched using the first hard mask 108 in which the aperture 108a is formed as a mask. As a result, a wiring trench 124 having a specified depth and connected to the via hole 116 is formed in the low-dielectric film 106 (FIG. 10H). In this etching process, the second hard mask 110 on the first hard mask 108 is removed.

Figure 10I:
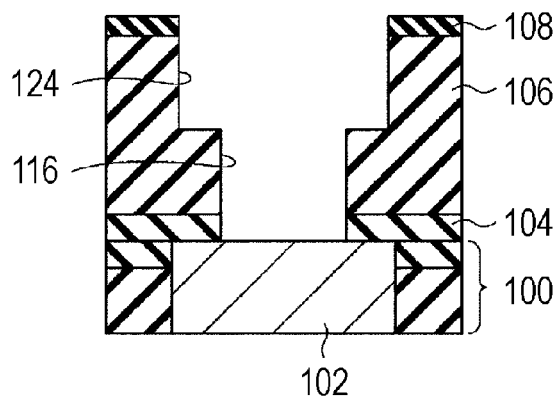

Then, the barrier film 104 at the bottom of the via hole 116 is removed by dry etching. As a result, the via hole 116 is formed to the top of the wiring layer 102 (FIG. 10I).

Figure 10J:
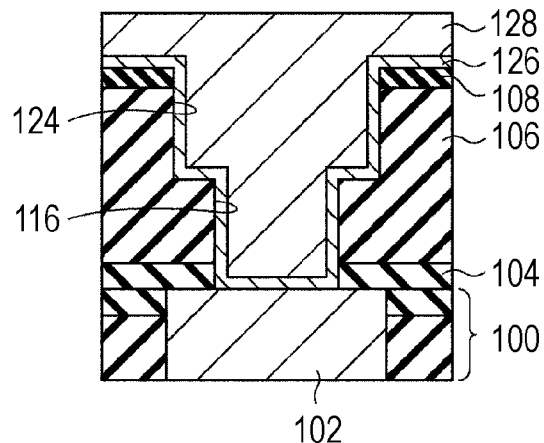

Then, after wet washing, a barrier metal and a Cu seed are deposited by, for example, sputtering, followed by Cu plating. As a result, the via hole 116 and the wiring trench 124 are filled with a barrier metal 126 and a Cu film 128 (FIG. 10J).

Figure 10K:
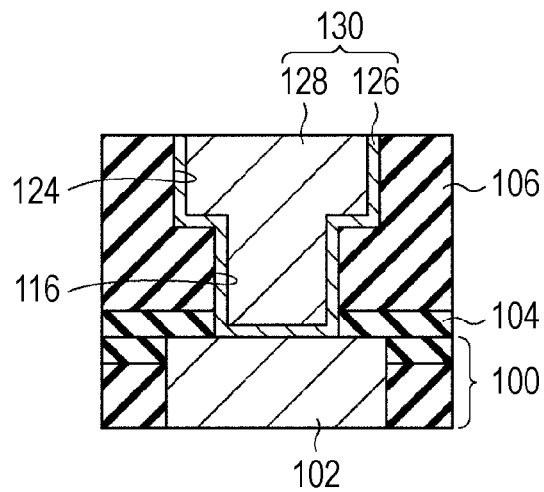

Then, the Cu film 128, the barrier metal 126, the first hard mask 108, and an upper portion of the low-dielectric film 106 are polished by a CMP method to selectively leave the Cu film 128 and the barrier metal 126 in the via hole 116 and the wiring trench 124. As a result, a wiring layer 130 having the barrier metal 126 and the Cu film 128 and connected to the wiring layer 102 is formed in the via hole 116 and the wiring trench 124 (FIG. 10K).

Figure 10L:
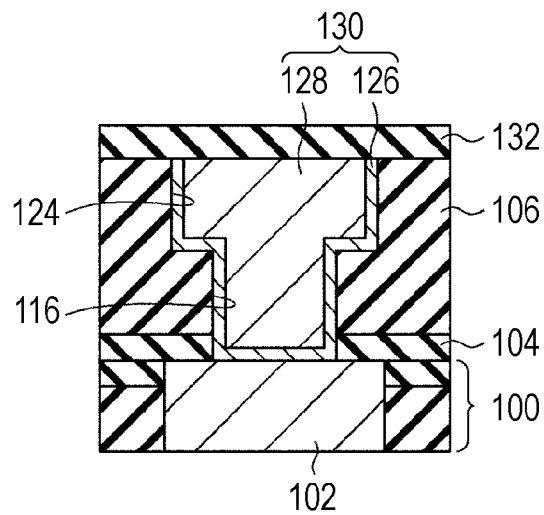

Next, a cap film 132 is formed on the low-dielectric film 106 in which the wiring layer 103 is buried (FIG. 10L).

Consequently, the wiring layer 130 buried in the low-dielectric film 106 is formed by the dual damascene process.

A decrease in the dielectric constant of the interlayer insulating film is generally accompanied by an increase in etching rate. That is, the etching rate of the low-dielectric film 106 in which the wiring layer 130 is buried is relatively high, and thus the etching selection ratio of the low-dielectric film 106 to the barrier film 104 is relatively high regardless of the etching gas used. Therefore, when the barrier film 104 at the bottom of the via hole 116 is dry-etched, the low-dielectric film 106 is also etched. As a result, when the barrier film 104 at the bottom of the via hole 116 is etched off, the wiring trench 124 is excessively dug to a depth larger than the design depth.

On the other hand, when the depth of the wiring trench 124 formed in the low-dielectric film 106 is maintained at the design depth, the barrier film 104 cannot be completely removed. As a result, electric connection cannot be secured between the wiring layer 130 and the wiring layer 102 disposed below the wiring layer 130 at the bottom of the via hole 116, thereby causing an open defect.

Here, excessive digging of the wiring trench and an open defect when the low-dielectric film is used as the interlayer insulating film are described with reference to FIGS. 11A to 11C and FIGS. 12A to 12C.

Etching for removing the barrier film 104 at the bottom of the via hole 116 may be performed after trench etching for forming the wiring trench 124 as described above. Alternatively, the etching may be performed at the same time as trench etching.

Figure 11A:
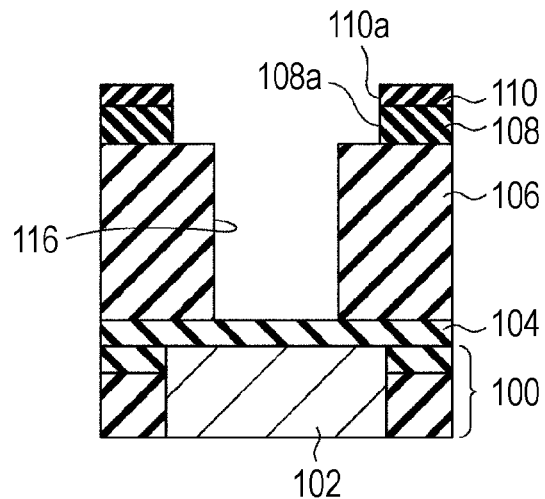
FIGS. 11A to 11C are drawings illustrating the occurrence of excessive digging of a trench and an open defect when a low-dielectric film is used as an interlayer insulating film.
Figure 11B:
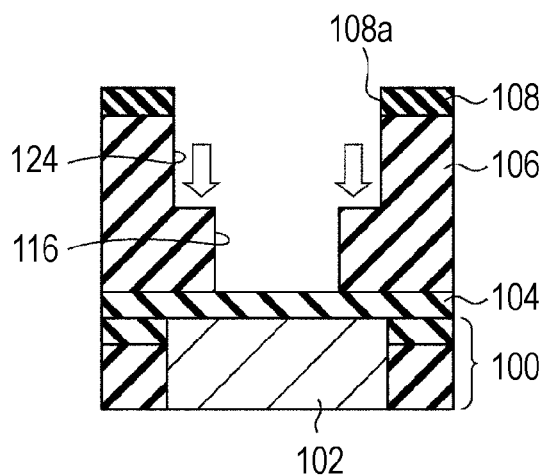
Figure 11C:
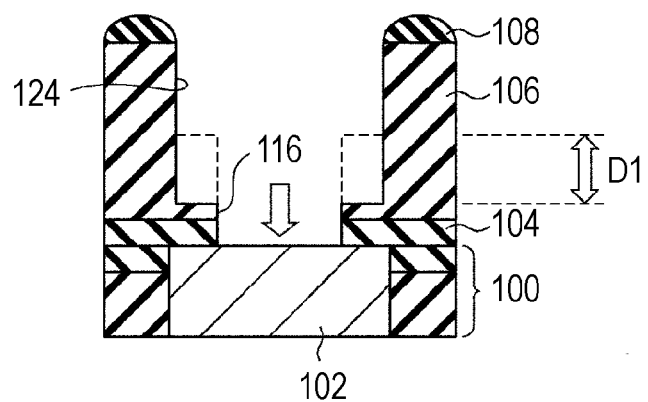

FIGS. 11A to 11C are drawings illustrating the occurrence of excessive digging of the wiring trench and an open defect when the barrier film is etched after trench etching.

In this case, as depicted in FIG. 11B, the low-dielectric film 106 is dry-etched using the first hard mask 110 in which the aperture 110a is formed as a mask to expose the wiring trench forming region depicted in FIG. 11A. Consequently, the wiring trench 124 is formed to a design depth in the low-dielectric film 106.

Next, as depicted in FIG. 11C, the barrier film 104 at the bottom of the via hole 116 is dry-etched. In this case, since the etching selection ratio of the low-dielectric film 106 to the barrier film 104 is relatively high regardless of the etching gas system used, not only the barrier film 104 is etched, but also the low-dielectric film 106 is etched. As a result, the wiring trench 124 is excessively dug, and the depth of the wiring trench 124 is deeper than the design value due to excessive digging of depth D1. In this case, when the depth of the wiring trench 124 is maintained at the design value, the barrier film 104 at the bottom of the via hole 116 cannot be completely removed, thereby causing an open defect.

Figure 12A:
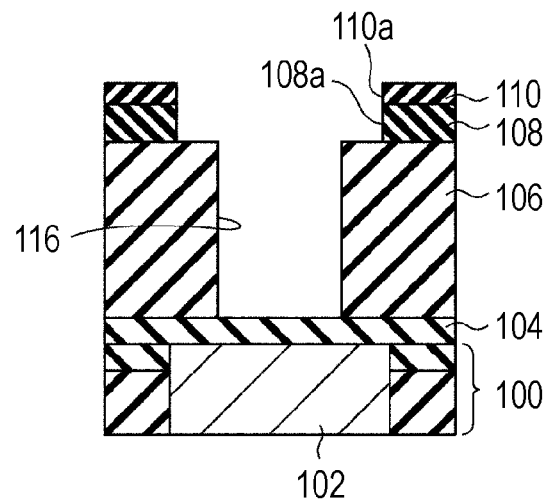
FIGS. 12A to 12C are drawings illustrating the occurrence of excessive digging of a trench and an open defect when a low-dielectric film is used as an interlayer insulating film.
Figure 12B:
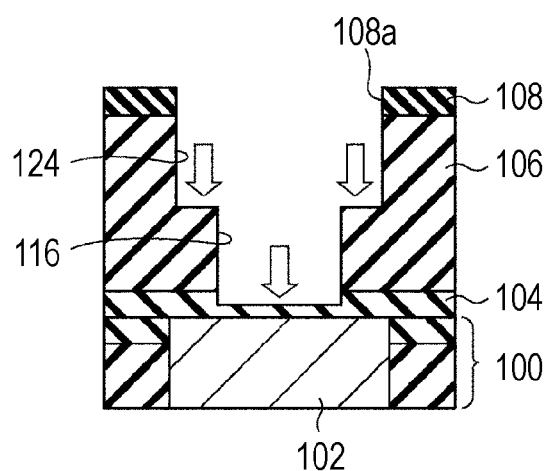
Figure 12C:
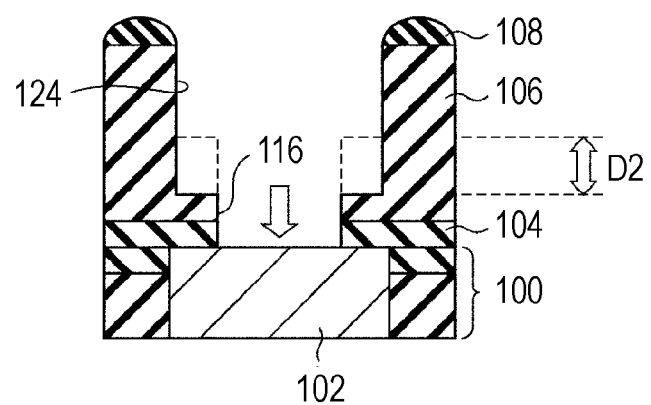

FIGS. 12A to 12C are drawings illustrating the occurrence of excessive digging of a wiring trench and an open defect when barrier film etching and trench etching are performed simultaneously.

In this case, depicted as FIG. 12B, the low-dielectric film 106 and the barrier film 104 at the bottom of the via hole 116 are dry-etched using the first hard mask 110 in which the aperture 110a is formed as a mask to expose the wiring trench forming region depicted as FIG. 12A. Consequently, the wiring trench 124 is formed to a design depth and the barrier film 104 at the bottom of the via hole 116 is removed. In this case, however, as described above, since the etching selection ratio of the low-dielectric film 106 to the barrier film 104 is relatively high regardless of the etching gas used, the low-dielectric film 106 is etched at a higher etching selection ratio than the barrier film 104. As a result, at the time when the wiring trench 124 is dug to the design depth, the barrier film 104 at the bottom of the via hole 106 cannot be completely removed and part of the barrier film 104 remains. When the barrier film 104 remaining at the bottom of the via hole 106 is etched off, as depicted in FIG. 12C, the wiring trench 124 is excessively dug, and the depth of the wiring trench 124 is deeper than the design value due to excessive digging of depth D2.

As described above, as the dielectric constant of the interlayer insulating film decreases, it becomes difficult to form the wiring trench with a design depth and completely remove the barrier film at the via hole.

As a result of intensive research, the inventors conceived an etching process capable of realizing both the formation of a wiring trench with a design depth and the removal of a barrier film at the bottom of a via hole even when a low-dielectric film is used as the interlayer insulating film.

Embodiment

A method for manufacturing a semiconductor device according to an embodiment is described.

The method for manufacturing a semiconductor device according to the embodiment includes an etching process using a two-layer structure hard mask so that a wiring layer is formed by a dual damascene process. The method for manufacturing a semiconductor device is first described, and then the etching process according to the embodiment is described in detail.

First, an element separating film 12 for defining an element region is formed on a semiconductor substrate 10, for example, a silicon substrate, by, for example, an STI (Shallow Trench Isolation) process.

A MOS transistor 18 having a gate electrode 14 and a source/drain region 16 is formed on the element region defined on the semiconductor substrate 10 by the same method as a usual method for manufacturing MOS transistors (FIG. 1A). On the semiconductor substrate 10, not only the MOS transistor, but also various semiconductor elements may be formed.

A silicon oxide film or the like is deposited by, for example, a CVD process on the semiconductor substrate 10 on which the MOS transistor has been formed, thereby forming an interlayer insulating film 20 including a silicon oxide film or the like.

The surface of the interlayer insulating film 20 is planarized by, for example, a CMP process.

A contact hole 22 is formed by photolithography and dry etching in the interlayer insulating film 20 to reach the source/drain region 16.

Figure 1B:
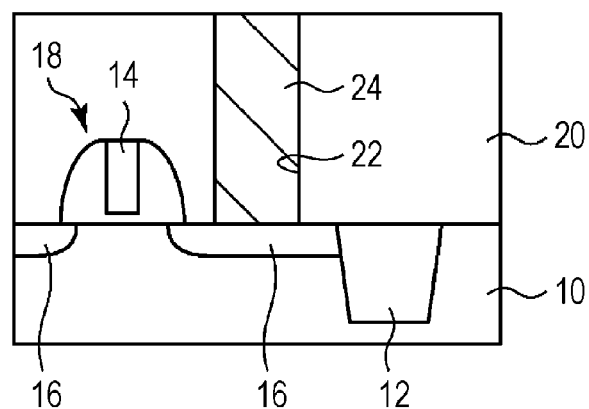

A barrier metal and a tungsten film are deposited by, for example, a CVD process and then the conductive films are etched back or polished back. As a result, a contact plug 24 buried in the contact hole 22 and connected to the source/drain regions 16 is formed (FIG. 1B).

For example, a SiOC film as a low-dielectric film and a SiC film are deposited by, for example, a CVD process on the interlayer insulating film 20 in which the contact plug 24 has been buried. As a result, an interlayer insulating film 30 including a SiOC film as a low-dielectric film 26 and a SiC film 28 is formed.

A wiring trench 32 is formed in the interlayer insulating film 30 by photolithography and dry etching.

A barrier metal and a Cu seed are deposited by, for example, a sputtering process, followed by Cu plating. As a result, the wiring trench 32 is filled with a barrier metal 34 and the Cu film 36.

Figure 1C:
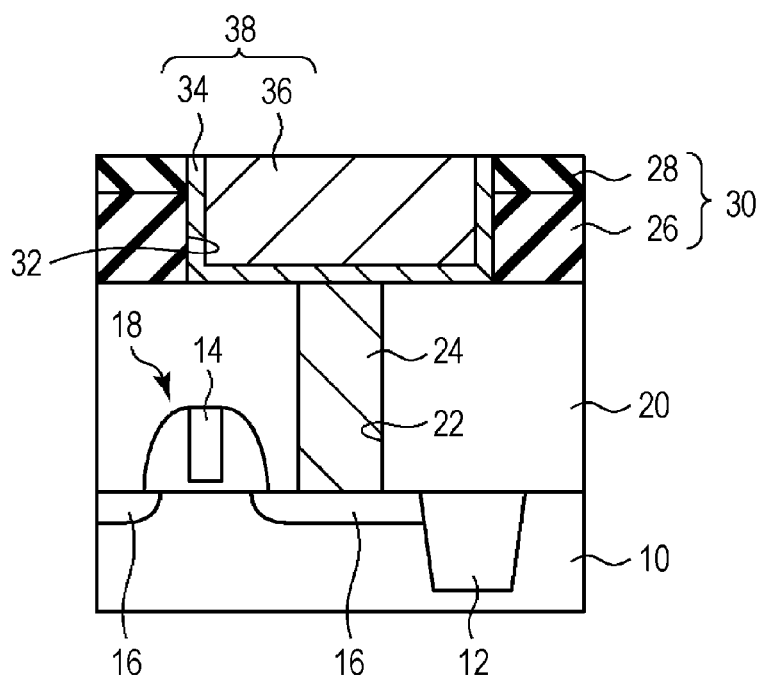

The Cu film 36 and the barrier metal 34 are polished by a CMP process until the interlayer insulating film 30 is exposed, thereby selectively leaving the Cu film 36 and the barrier metal 34 in the wiring trench 32. Consequently, a wiring layer 38 including the barrier metal 34 and the Cu film 36 and connected to the contact plug 24 is formed in the wiring trench 32 (FIG. 1C).

A SiC film having a thickness of, for example, 30 nm is deposited by, for example, a plasma CVD process on the interlayer insulting film 30 in which the wiring layer 38 has been buried to form a barrier film 40 including a SiC film. The barrier film 40 functions to prevent if not reduce diffusion of Cu from the wiring layer 38 and functions as an etching stopper in via etching for forming a via hole 52 which will be described below.

A SiOC film having a thickness of, for example, 250 nm is deposited on the barrier film 40 by, for example, a plasma CVD process to form a low-dielectric film 42 including a SiOC film. The deposition conditions for the SiOC film by the plasma CVD process are, for example, as follows: as a raw material gas to be introduced into a deposition chamber, for example, a mixed gas containing TMSA (trimethylsilylacetylene) gas, CO gas, and $O_2$ gas may be used. The pressure in the deposition chamber may be, for example, 6 Torr, and the substrate temperature may be, for example, 400° C.

A silicon oxide film (SiO film) having a thickness of, for example, 50 nm is deposited on the low-dielectric film 42 by, for example, a plasma CVD process to form a first hard mask 44 including a SiO film.

Figure 1D:
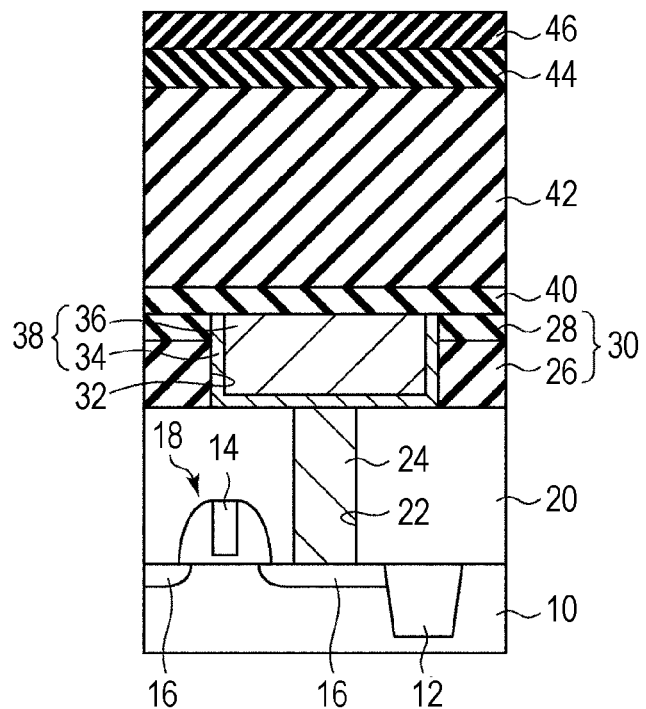

A silicon nitride film (SiN film) having a thickness of, for example, 20 nm is deposited on the first hard mask 44 by, for example, a plasma CVD process to form a second hard mask 46 including a SiN film having different etching properties from those of the first hard mask 44 (FIG. 1D).

A BARC film 48 is formed as an antireflection film on the second hard mask 46.

Figure 1E:
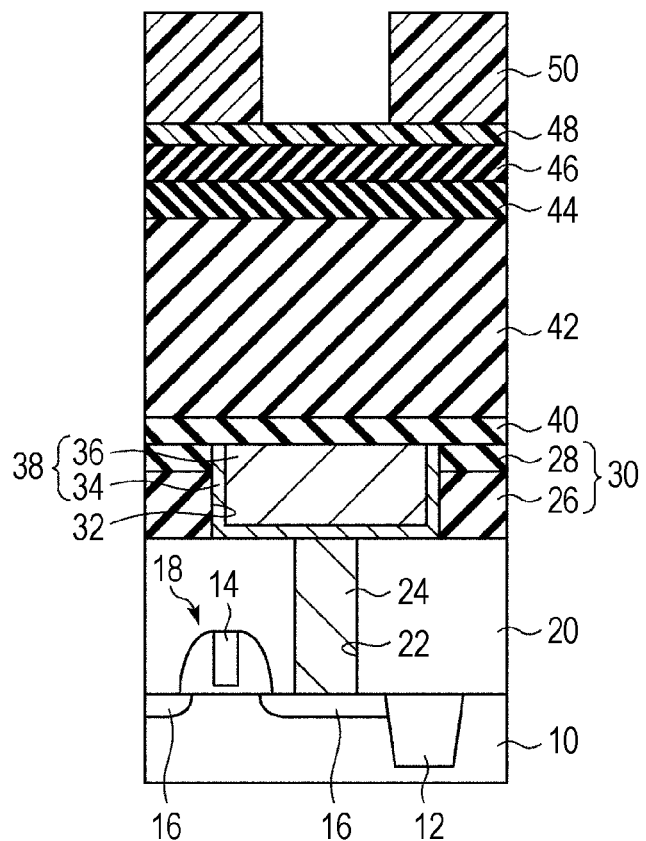

A photoresist film 50 used for exposing a via hole forming region is formed on the BARC film 48 by photolithography (FIG. 1E).

The second hard mask 46, the first hard mask 44, and the low-dielectric film 42 are dry-etched using the photoresist film 50 as a mask and the barrier film 40 as a stopper. As a result, the via hole 52 is formed in the second hard mask 46, the first hard mask 44, and the low-dielectric film 42.

Figure 1F:
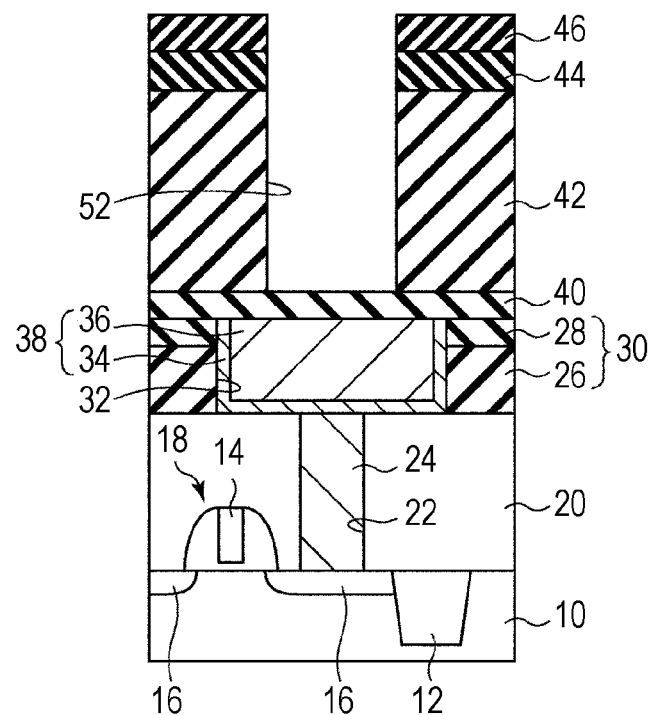

The photoresist film 50 and the BARC film 48 are removed by, for example, ashing (FIG. 1F).

Figure 1G:
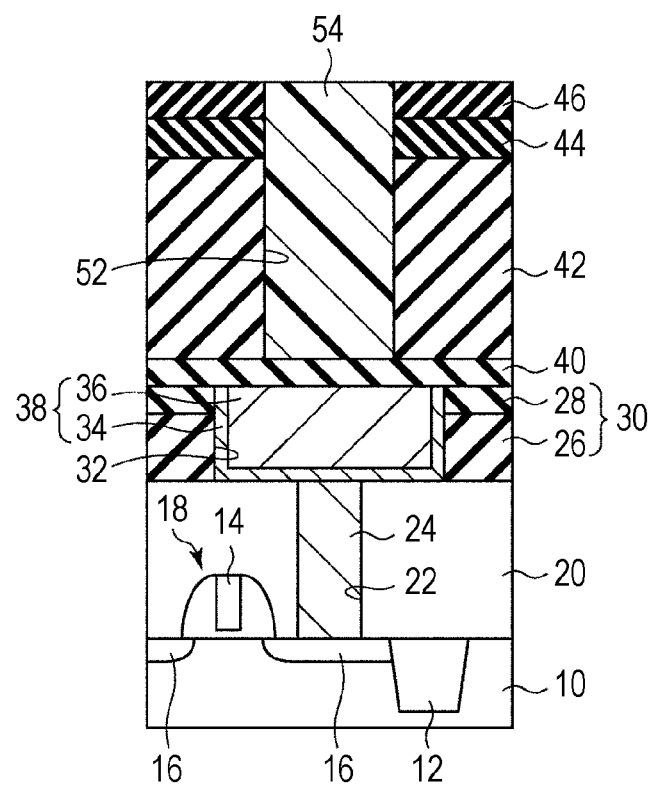

A resin material such as photoresist or the like is applied over the entire surface and cured, and the resin material is etched back. As a result, the via hole 116 is filled with a buried material 54 including the resin material, and the surface is planarized (FIG. 1G).

A BARC film 56 is formed as an antireflection film on the second hard mask 46 in which the buried material 54 has been buried.

Figure 1H:
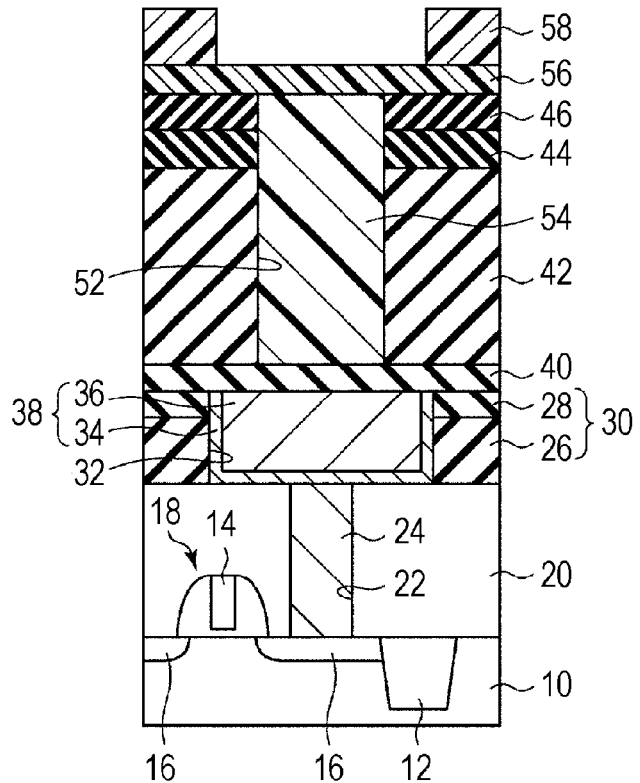

A photoresist film 58 used for exposing a wiring trench forming region including via hole forming region is formed on the BARC film 56 by photolithography (FIG. 1H).

Figure 1I:
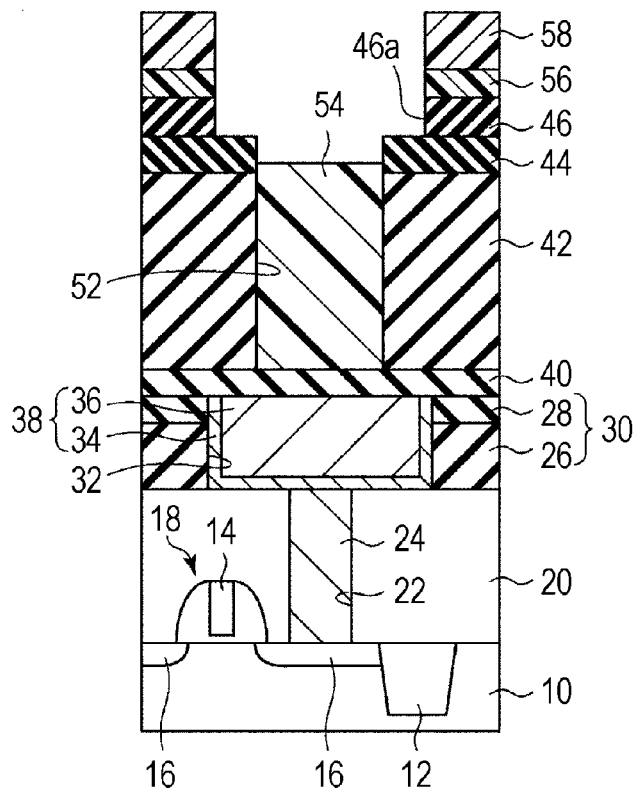

The BARC film 56 and the second hard mask 46 are dry-etched using the photoresist film 58 as a mask. As a result, an aperture 46a is formed in the second hard mask 46 to expose a wiring trench forming region (FIG. 1I). The BARC film 56 may be etched with, for example, a $CF_4$-based etching gas. The second hard mask 46 may be etched with, for example, a $CH_2F_2/O_2/Ar$-based etching gas.

Figure 1J:
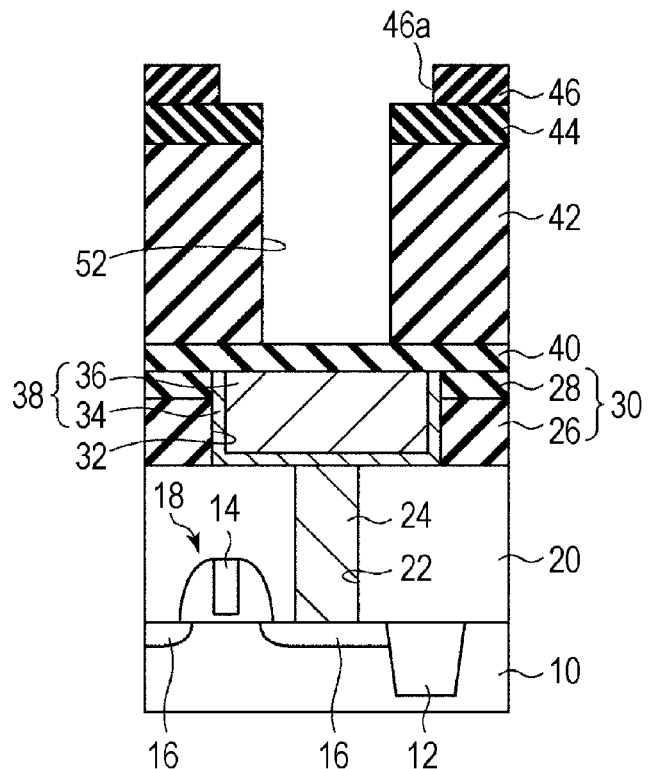

The photoresist film 58, the BARC film 56, and the buried material 54 are removed by, for example, ashing (FIG. 1J).

Figure 1K:
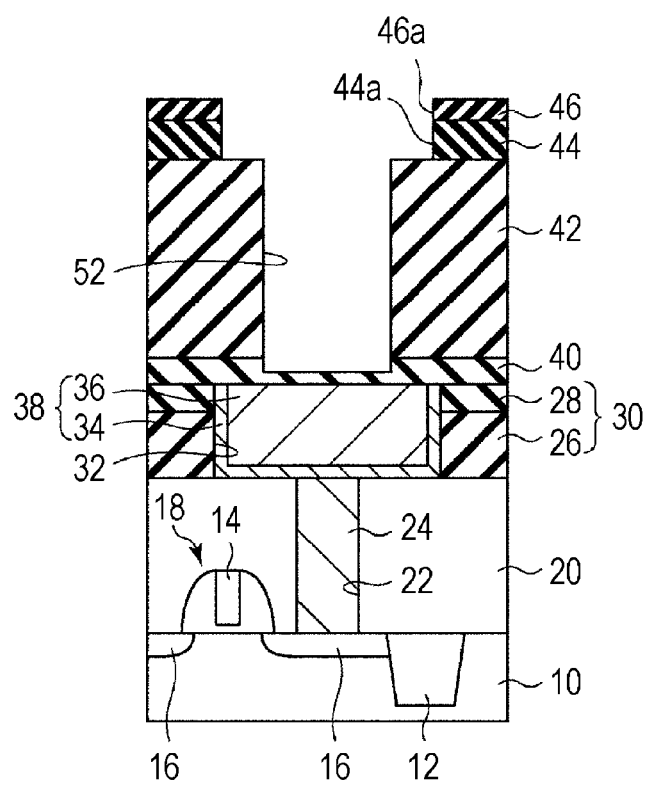

The first hard mask 44 is etched by dry etching with a $C_4F_6/N_2$-based etching gas using the second hard mask 46 in which the aperture 46a is formed as a mask, and the barrier film 40 at the bottom of the via hole 52 is etched. Consequently, an aperture 44a is formed in the first hard mask 44 to expose a wiring trench forming region, and the barrier film 40 at the bottom of the via hole 52 is partially removed (FIG. 1K). The etching conditions may include, for example, an etching gas $C_4F_6/N_2$ flow rate of 50/500 sccm, a treatment chamber pressure of 100 mtorr, and a bias power of 200 W. The barrier film 40 at the bottom of the via hole 52 may be etched, for example, 15 nm.

Figure 1L:
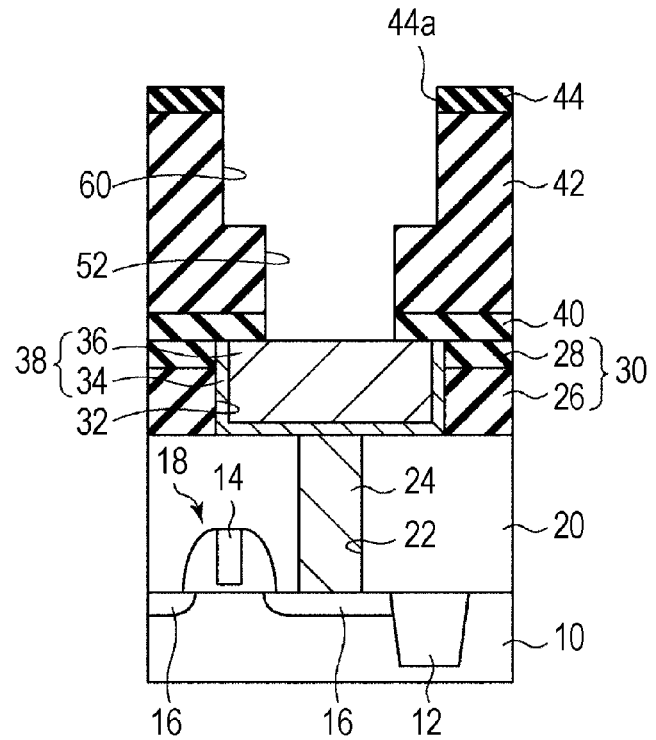

The low-dielectric film 42 is etched by dry etching with a $CHF_3$-based etching gas using the first hard mask 44 in which the aperture 44a is formed as a mask, and the barrier film 40 at the bottom of the via hole 52 is etched. Consequently, a wiring trench 60 connected to the via hole 52 is formed in the low-dielectric film 44, and the barrier film 40 at the bottom of the via hole 52 is removed (FIG. 1L). The via hole 52 is formed to the top of the wiring layer 38. The etching conditions include, for example, an etching gas $CHF_3/O_2/N_2$ flow rate of 200/50/150 sccm, a processing chamber pressure of 100 mTorr, and a bias power of 100 W. In addition, the etching time is controlled so that the depth of the wiring trench 60 from the surface of the low-dielectric film 42 may be, for example, 170 nm. In this etching process, the second hard mask 46 on the first hard mask 44 is removed. About 30 nm, for example, of the first hard mask 44 remains without shoulder rounding.

Figure 1M:
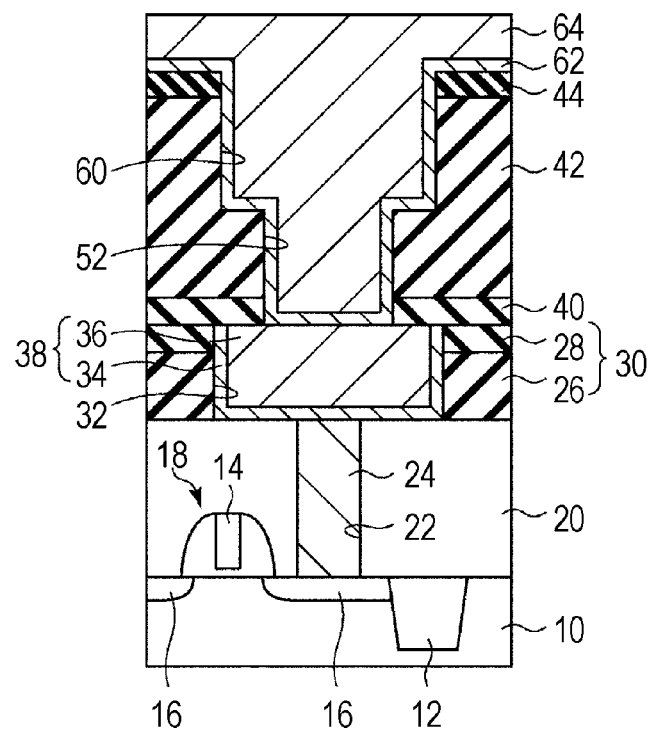

After wet washing, a Ta film barrier metal and a Cu seed are deposited by, for example, a sputtering process, followed by Cu plating. As a result, the via hole 52 and the wiring trench 60 are filled with a barrier metal 62 and a Cu film 64 (FIG. 1M).

Figure 1N:
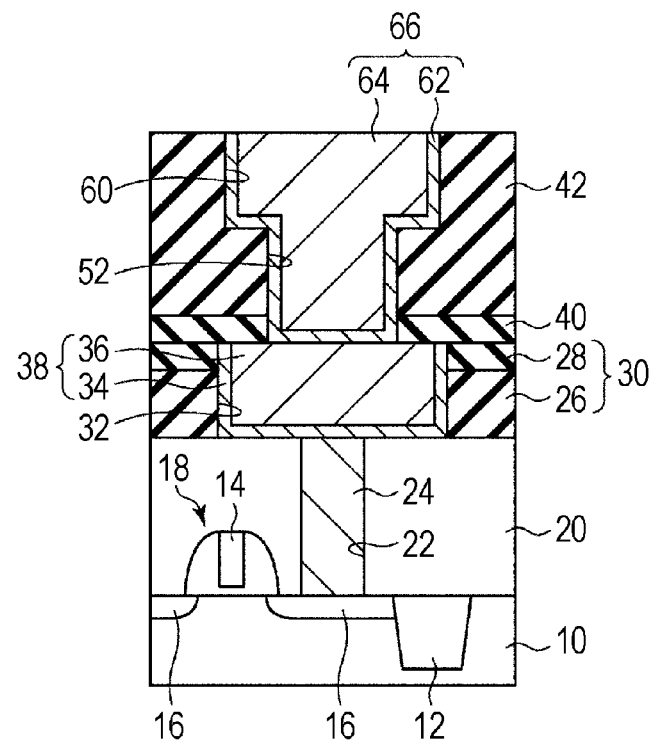

The Cu film 64, the barrier metal 62, the first hard mask 44, and an upper portion of the low-dielectric film 42 are polished by a CMP method to selectively leave the Cu film 64 and the barrier metal 62 in the via hole 52 and the wiring trench 60. An upper portion of the low-dielectric film 42 is polished by, for example, 30 nm. As a result, a wiring layer 66 including the barrier metal 62 and the Cu film 64 and connected to the wiring layer 38 is formed in the via hole 52 and the wiring trench 60 (FIG. 1N).

Figure 1O:
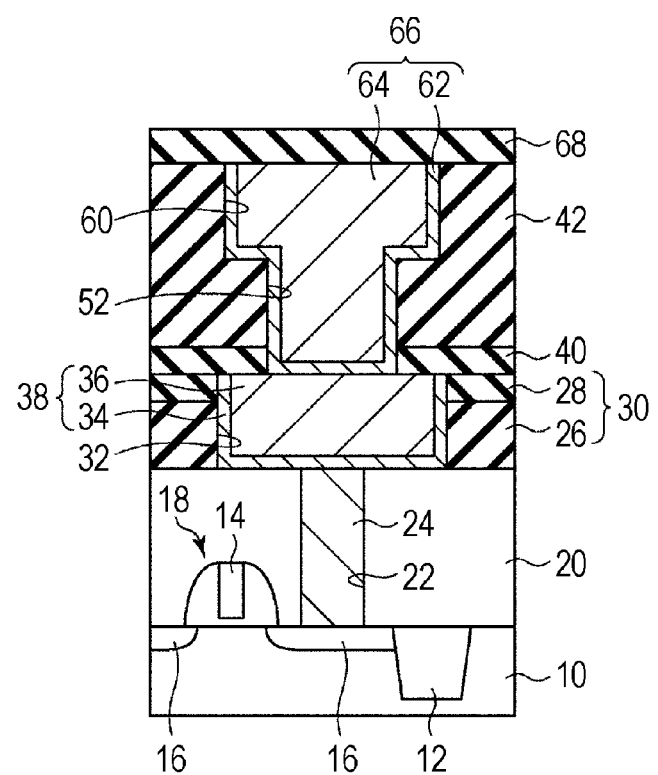

A SiC film having a thickness of, for example, 30 nm is deposited on the low-dielectric film 42 in which the wiring layer 66 has been buried, thereby forming a cap film 68 including a SiC film (FIG. 1O).

As described above, the wiring layer 66 buried in the low-dielectric film 42 is formed by the dual damascene process.

After that, if required, wiring layers are repeatedly formed on the wiring layer 66 to complete a semiconductor device having multilayer wiring.

Figure 2A:
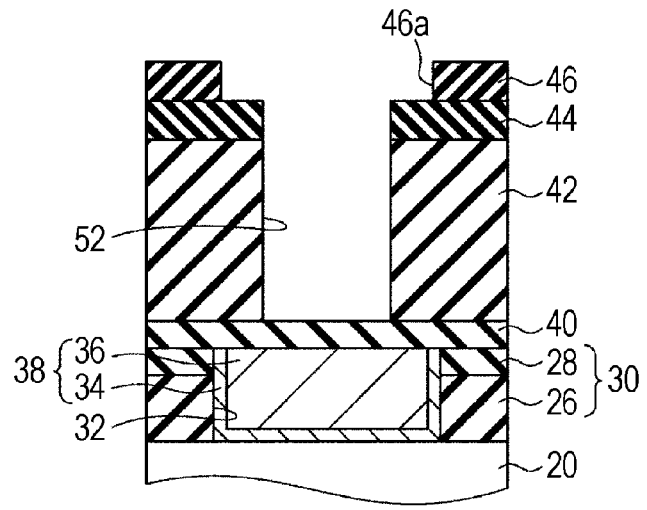
FIGS. 2A to 2C are drawings illustrating etching using a two-layer structure hard mask.
Figure 2B:
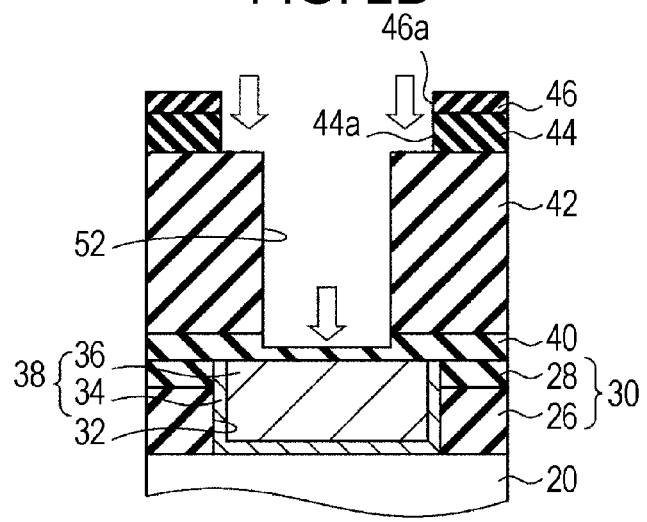
Figure 2C:
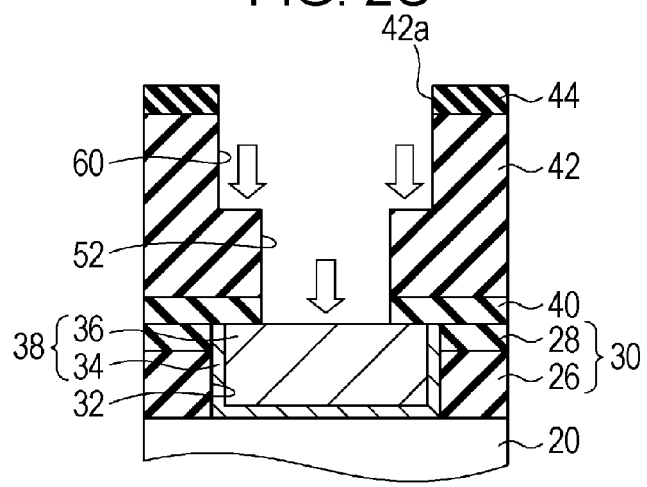

In the above-described method for manufacturing the semiconductor device, depicted as FIG. 2B, the first hard mask 44 composed of a SiO film is etched using the second hard mask 46 composed of a SiN film and having the aperture 46a formed therein as a mask as depicted in FIG. 2A. At this time, the barrier film 40 including a SiC film at the bottom of the via hole 52 is also etched. The etching process using the second hard mask 46 uses a $C_4F_6/N_2$-based etching gas. Consequently, the aperture 44a used for exposing the wiring trench forming region is formed in the first hard mask 44, and at the same time, the barrier film 40 at the bottom of the via hole 52 is partially removed (refer to FIG. 1K).

Also, in the above-described method for manufacturing the semiconductor device, as depicted in FIG. 2A, the low-dielectric film 42 composed of a SiOC film is etched using the first hard mask 44 composed of a SiO film having the aperture 44a formed therein as a mask. At this time, the barrier film 40 at the bottom of the via hole 52 is also etched. The etching process using the first hard mask 44 uses $CHF_3$-based etching gas. Consequently, the wiring trench 60 with a design depth is formed in the low-dielectric film 44, and at the same time, the barrier film 40 at the bottom of the via hole 52 is removed (refer to FIG. 1L).

The reason for using the $C_4F_6/N_2$-based etching gas when etching the first hard mask 44 composed of a SiO film using the second hard mask 46 composed of a SiN film as a mask is described in detail below.

Figure 3:
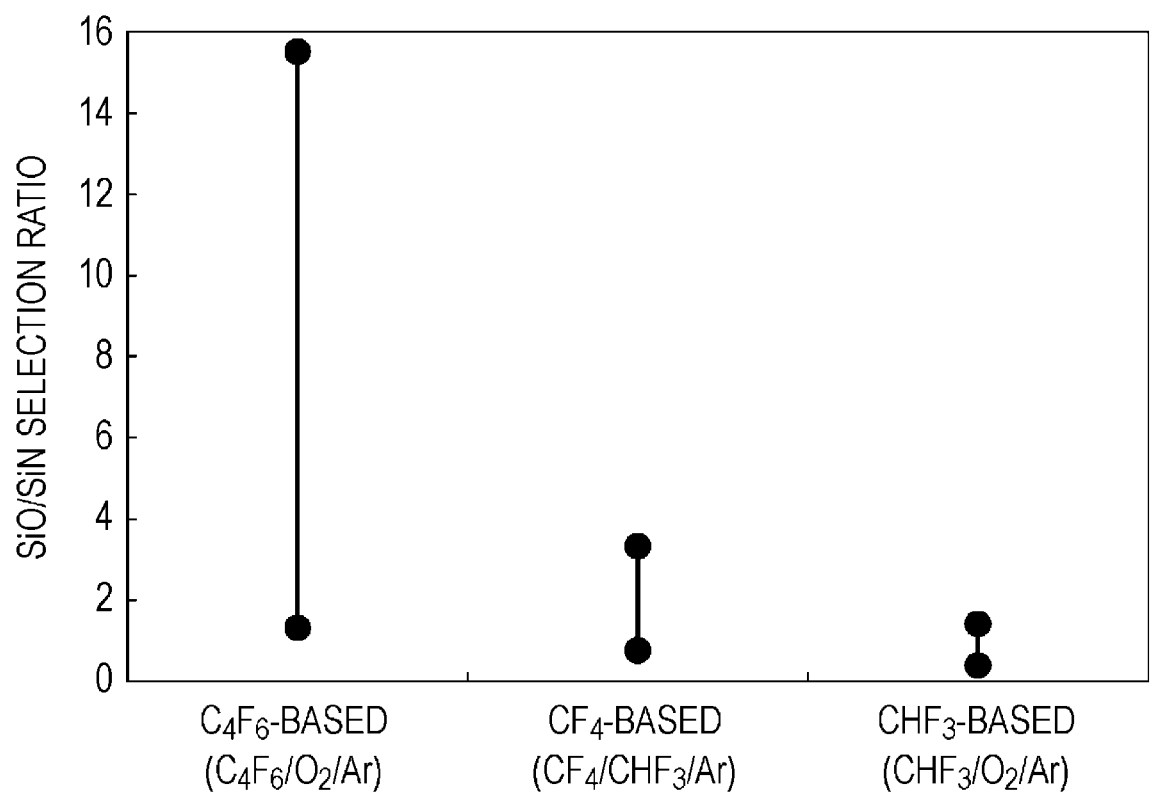
FIG. 3 is a graph depicting etching selection ratios of a SiO film to a SiN film when various etching gases are used.

FIG. 3 depicts etching selection ratios (SiO/SiN selection ratio) comparing a SiO film to a SiN film when $C_4F_6$-based, $CF_4$-based, and $CHF_3$-based etching gases are used. A $C_4F_6/O_2/Ar$ gas may be used as the $C_4F_6$-based etching gas, a $CF_4/CHF_3/Ar$ gas may be used as the $CF_4$-based etching gas, and a $CHF_3/O_2/Ar$ gas may be used as the $CHF_3$-based etching gas.

When the first hard mask 44 composed of a SiO film is etched using the second hard mask 46 composed of a SiN film as a mask a relatively high SiO/SiN selection ratio is preferred. A SiO/SiN selection ratio of, for example, at least 5 or more is preferred.

Figure 4A:
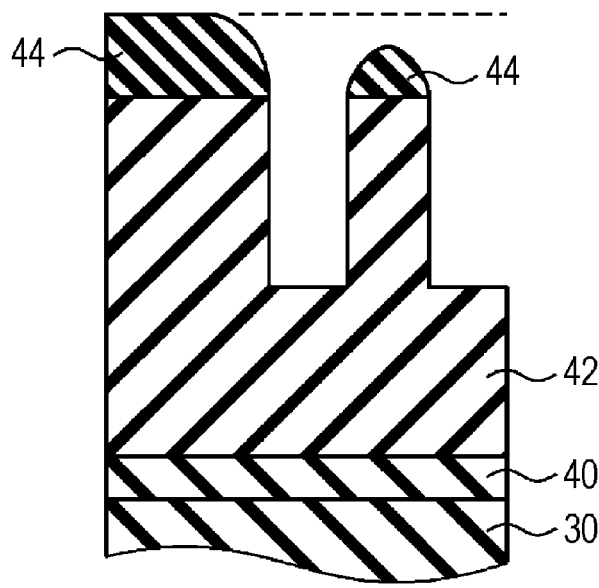
FIGS. 4A and 4B are drawings depicting sectional shapes after etching of a first hard mask using a relatively thick second hard mask and a relatively thin second hard mask, respectively.
Figure 4B:
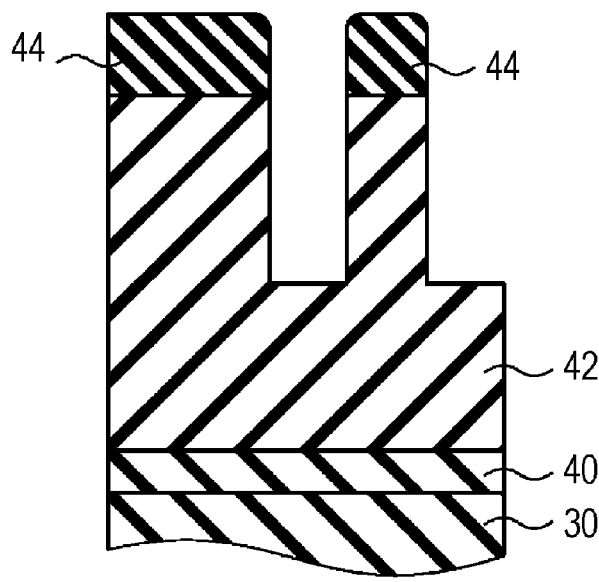

The second hard mask 46 is relatively thin and has a thickness of, for example, 30 nm or less. The reason for this is as follows: when a relatively thick second hard mask 46 having a thickness of, for example, over 30 nm is used, etching of the first hard mask 44 proceeds differently in different patterns due to a difference in line width or the like. As a result, as depicted in FIG. 4A, shoulder rounding may occur in the first hard mask 44, thereby causing a difference in thickness of the remaining first hard mask 44 between different patterns. Therefore, in etching using the first hard mask 44 as a mask, the processed shape of a pattern is degraded. On the other hand, when the relatively thin second hard mask 46 having a thickness of, for example, 30 nm or less is used, etching of the first mask 44 may uniformly proceed even with different patterns. As a result, as depicted in FIG. 4B, shoulder rounding of the first hard mask 44 is sufficiently suppressed, thereby ensuring that the thickness of the remaining first hard mask 44 is approximately uniform between different patterns. Therefore, in etching using the first hard mask 44 as a mask, deterioration in the patterned shape may be reduced if not prevented.

The lower limit of the thickness of the second hard mask 46 depends on the thickness of the first hard mask 44 to be etched, but the thickness of the second hard mask 46 is preferably set at, for example, 15 nm or more.

As described above, since a relatively thin second hard mask 46 is used, when the first hard mask 44 is etched using the second hard mask 46 as a mask, a relatively high SiO/SiN selection ratio is preferable.

FIG. 3 indicates that a SiO/SiN selection ratio of 5 or more may be attained only when the $C_4F_6$-based etching gas is used. This result indicates that the $C_4F_6$-based etching gas is preferred as the etching gas for etching the first hard mask 44 composed of a SiO film using the second hard mask 46 composed of a SiN film as a mask.

Figure 5A:
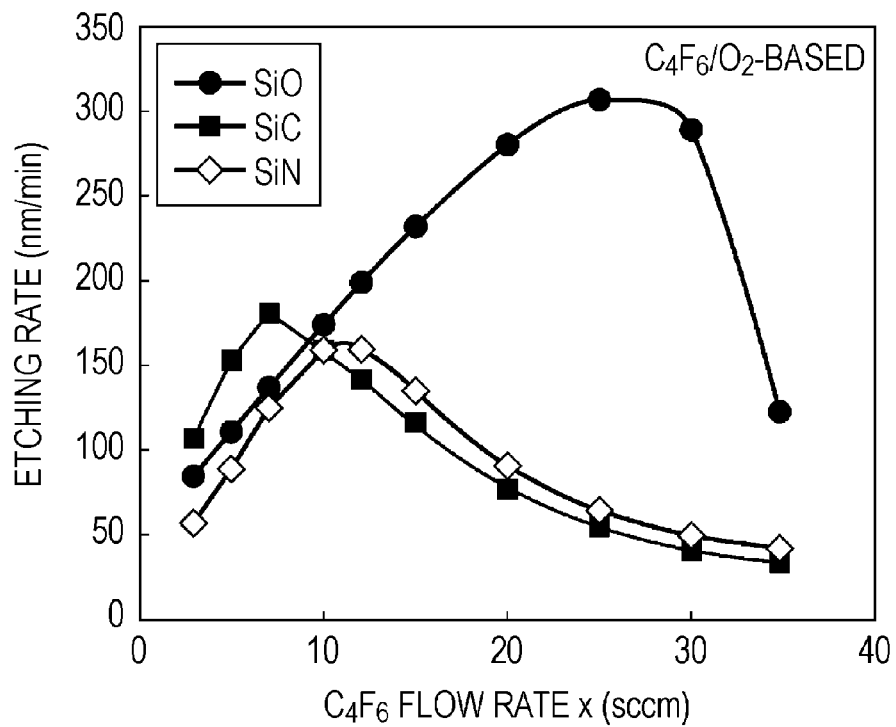
FIGS. 5A and 5B are graphs depicting $C_4F_6$ flow rate dependencies of the etching rates of a SiO film, a SiC film, and a SiN film when a $C_4F_6/O_2$ etching gas and a $C_4F_6/N_2$ etching gas are used.
Figure 5B:
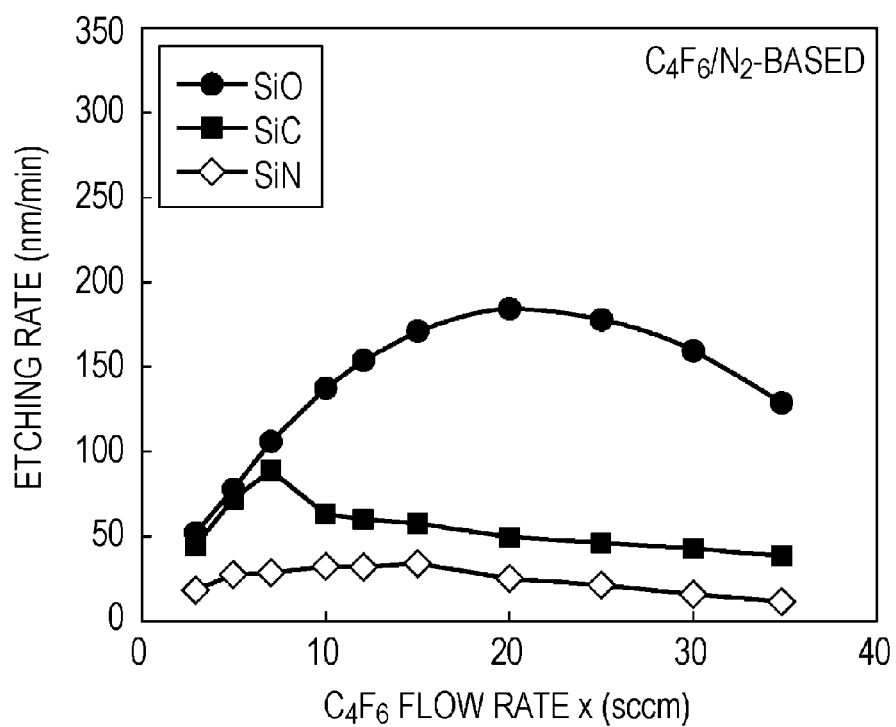

FIGS. 5A and 5B depict $C_4F_6$ flow rate dependencies of the etching rates of a SiO film, a SiC film, and a SiN film when a $C_4F_6/O_2$ etching gas containing $O_2$ and a $C_4F_6/N_2$ etching gas containing $N_2$ are used as $C_4F_6$-based gases. FIG. 5A depicts the $C_4F_6$ flow rate dependency of the etching rate of each of the films using the $C_4F_6/O_2$ etching gas. In this case, a $C_4F_6/O_2/Ar$ gas is used as the $C_4F_6/O_2$ etching gas, and the $C_4F_6/O_2/Ar$ flow rate ratio is x/20/(400−x) (sccm). FIG. 5B depicts the $C_4F_6$ flow rate dependency of the etching rate of each of the films using the $C_4F_6/N_2$ etching gas. In this case, the $C_4F_6/N_2/Ar$ gas is used as the $C_4F_6/N_2$ etching gas, and the $C_4F_6/N_2/Ar$ flow rate ratio is x/200/(400−x) (sccm). In FIGS. 5A and 5B, the $C_4F_6$ flow rate x is depicted on the abscissa axis, and the etching rate is depicted on the ordinate axis.

FIGS. 5A and 5B demonstrate that when the $C_4F_6$-based etching gas is used, the etching rate of the SiO film is higher than the etching rates of the SiN film and the SiC film. This is because the polymer deposited by the $C_4F_6$ in the etching gas may be removed by evaporation with oxygen (O) contained in the SiO film.

Figure 6:
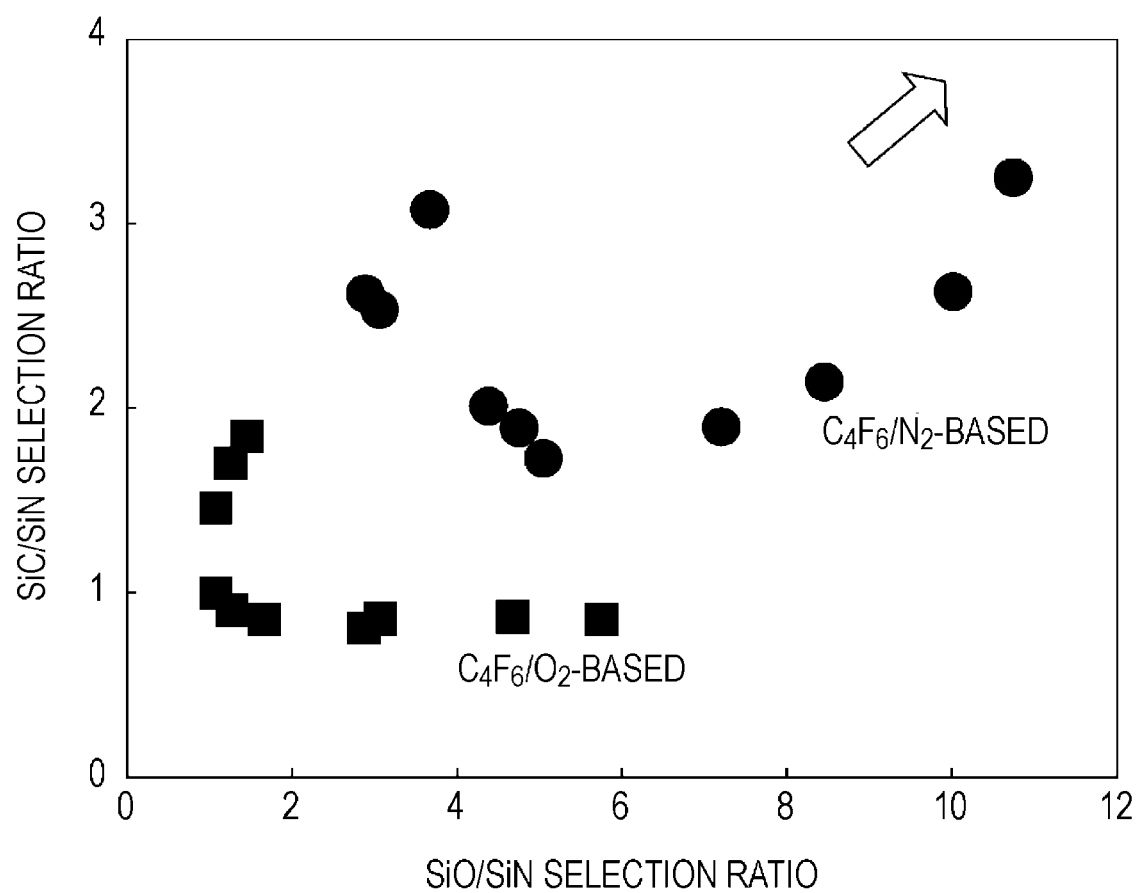
FIG. 6 is a graph depicting the etching selection ratios of a SiO film to a SiN film and the etching selection ratios of a SiC film to a SiN film when a $C_4F_6/O_2$ etching gas and a $C_4F_6/N_2$ etching gas are used.

FIG. 6 is a graph depicting a relationship between the SiO/SiN selection ratio and the etching selection ratio (SiC/SiN selection ratio) of a SiC film to a SiN film on the basis of the etching rates of each of the films at the same $C_4F_6$ flow rate x depicted in FIGS. 5A and 5B. In FIG. 6, the SiO/SiN selection ratio is depicted on the abscissa axis, and the SiC/SiN selection ratio is depicted on the ordinate axis.

FIG. 6 indicates that when using the $C_4F_6/N_2$-based etching gas, a high SiO/SiN selection ratio and a high SiC/SiN selection ratio are obtained compared to the $C_4F_6/O_2$-based etching gas. In the case of the $C_4F_6/N_2$-based etching gas, a SiC/SiN selection ratio of at least 1 or more is obtained at any SiO/SiN selection ratio. On the other hand, when using the $C_4F_6/O_2$-based etching gas, a SiC/SiN selection ratio of 1 or more is obtained at a low SiO/SiN selection ratio of less than 2, but the SiC/SiN selection ratio is lower than 1 at a higher SiO/SiN selection ratio.

The possible reason why a relatively high SiC/SiN selection ratio is attained in the case of the $C_4F_6/N_2$-based etching gas is that $N_2$ contained in the etching gas exhibits reactivity with SiC but exhibits low reactivity with SiN. In contrast, the possible reason why a relatively low SiC/SiN selection ratio is obtained in the case of the $C_4F_6/O_2$-based etching gas is that $O_2$ contained in the etching gas exhibits reactivity with both SiC and SiN. As described above, in the case of the $C_4F_6/N_2$-based etching gas, $N_2$ contained in the etching gas may increase the SiC/SiN selection ratio while maintaining a high SiO/SiN selection ratio.

Therefore, in this embodiment, when the first hard mask 44 composed of a SiO film is etched using the second hard mask 46 composed of a SiN film as a mask, the $C_4F_6/N_2$-based etching gas is used. Consequently, when the first hard mask 44 is etched, the barrier film 40 including a SiC film at the bottom of the via hole 52 may be partially etched at a SiC/SiN selection ratio of at least 1 or more while maintaining a high SiO/SiN selection ratio. In this case, the SiC/SiN selection ratio, e.g., the etching selection ratio of the barrier film 40 to the second hard mask 46, is preferably set to 2 or more.

Therefore, when the first hard mask 44 is etched, the barrier film 40 at the bottom of the via hole 52 is partially etched, and thus the barrier film 40 at the bottom of the via hole 52 may be removed in subsequent etching for forming the wiring trench 60.

Next, with respect to the $C_4F_6/N_2$-based etching gas used for etching the first hard mask 44, a preferred range of the ratio ($C_4F_6/N_2$ flow rate ratio) of the $C_4F_6$ flow rate to the $N_2$ flow rate is described below.

Figure 7:
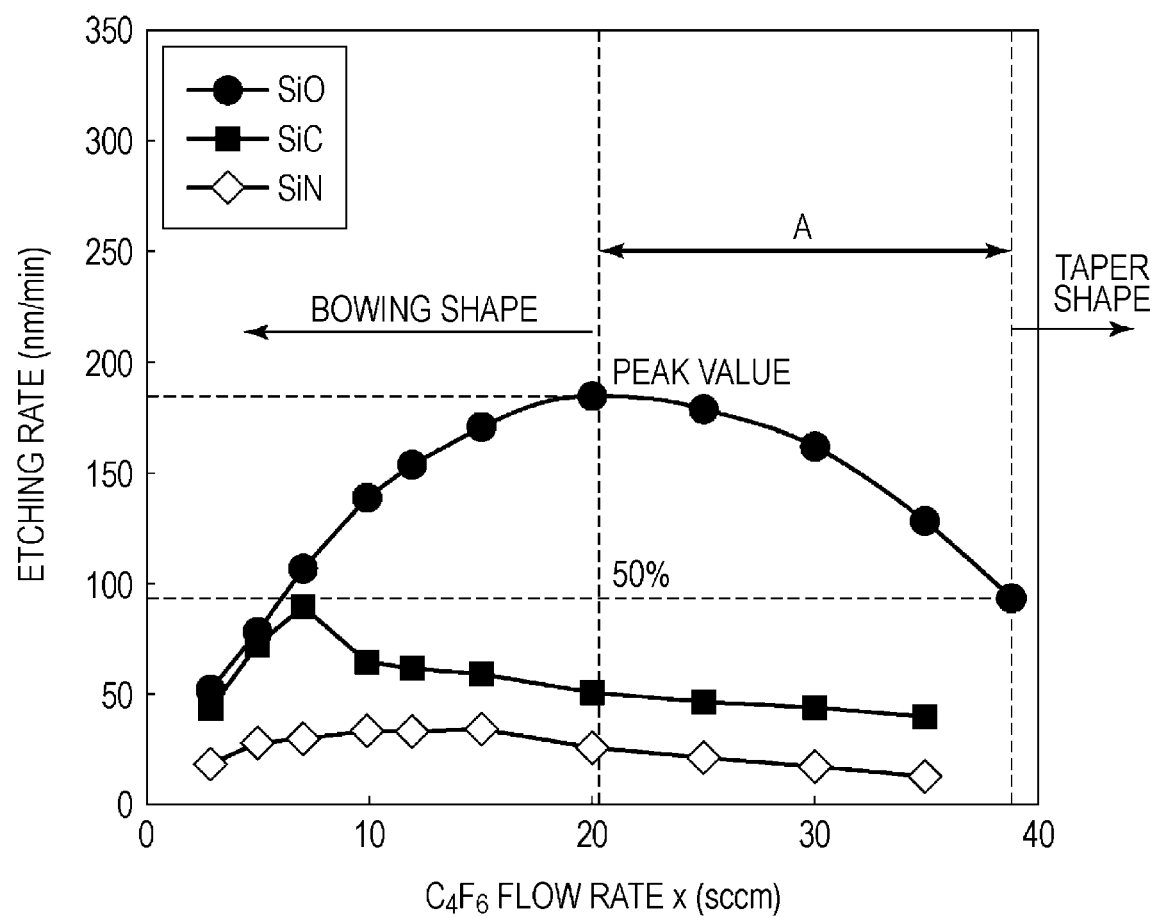
FIG. 7 is a graph depicting $C_4F_6$ flow rate dependencies of the etching rates of a SiO film, a SiC film, and a SiN film when a $C_4F_6/N_2$ etching gas is used.

FIG. 7 depicts the $C_4F_6$ flow rate dependencies of the etching rates of a SiO film, a SiC film, and a SiN film using a $C_4F_6/N_2$-based etching gas. A $C_4F_6/N_2/Ar$ gas is used as the $C_4F_6/N_2$-based etching gas, and the $C_4F_6/N_2/Ar$ flow rate is x/200/(400−x) (sccm). In FIG. 7, the $C_4F_6$ flow rate x is depicted on the abscissa axis, and the etching rate is depicted on the ordinate axis.

FIG. 7 indicates that the etching rate of the SiO film used as the first hard mask 44 exhibits $C_4F_6$ flow rate dependency, and increases as the $C_4F_6$ flow rate increases and then decreases as the $C_4F_6$ flow rate increases after a peak value at a certain $C_4F_6$ flow rate. The etching rate of the SiO film exhibits $C_4F_6/N_2$ flow rate ratio dependency, and increases as the $C_4F_6/N_2$ flow rate ratio increases and then decreases as the $C_4F_6/N_2$ flow rate ratio increases after a peak value at a certain $C_4F_6/N_2$ flow rate ratio. The peak value of the etching rate of the SiO film varies depending on etching conditions such as the pressure in the processing chamber, the bias power, and the like.

First, the $C_4F_6/N_2$ flow rate ratio of the $C_4F_6/N_2$-based etching gas is preferably set to be equal to or higher than the $C_4F_6/N_2$ flow rate ratio at which the etching rate of the SiO film used as the first hard mask 44 is a peak value of the $C_4F_6$ flow rate ratio dependency. This is because, as described below, deterioration of the pattern processed shape of the first hard mask 44 due to bowing may be reduced if not avoided.

That is, when the $C_4F_6/N_2$ flow rate ratio of the $C_4F_6/N_2$-based etching gas is lower than the $C_4F_6/N_2$ flow rate ratio at which the etching rate of the SiO film is a peak value of the $C_4F_6$ flow rate ratio dependency, the ratio of $C_4F_6$ in the etching gas is relatively low. Therefore, a polymer protecting film due to $C_4F_6$ is not sufficiently deposited on the side walls of an etched portion of a pattern. Therefore, etching easily proceeds in the lateral direction in the side walls of an etched portion of a pattern, thereby degrading the patterned shape due to bowing.

Therefore, the $C_4F_6/N_2$ flow rate ratio of the $C_4F_6/N_2$-based etching gas is preferably set to be higher than the $C_4F_6/N_2$ flow rate ratio at which the etching rate of the SiO film is a peak value in the $C_4F_6/N_2$ flow rate ratio dependency. In this case, when the first hard mask 44 including a SiO film is etched using the second hard mask 46 including a SiN film as a mask, the patterned shape of the first hard mask 44 may exhibit less bowing.

Further, the $C_4F_6/N_2$ flow rate ratio of the $C_4F_6/N_2$-based etching gas is preferably set to be lower than the $C_4F_6/N_2$ flow rate ratio at which the etching rate of the SiO film used as the first hard mask 44 is, for example, 50% of a peak value in the dependency on $C_4F_6/N_2$ flow rate ratio. This is to avoid or reduce deterioration of the patterned shape of the first hard mask due to tapering as described below.

That is, when the $C_4F_6/N_2$ flow rate ratio of the $C_4F_6/N_2$-based etching gas is higher than the $C_4F_6/N_2$ flow rate ratio at which the etching rate of the SiO film is, for example, 50% of a peak value in the dependency on $C_4F_6/N_2$ flow rate ratio, the ratio of $C_4F_6$ in the etching gas is relatively high. Therefore, a polymer protecting film due to $C_4F_6$ is excessively deposited on the side walls of an etched portion of a pattern. Therefore, etching proceeds at a lower rate in an etched portion of a pattern at a deeper position, thereby degrading the patterned shape due to tapering.

Therefore, the $C_4F_6/N_2$ flow rate ratio of the $C_4F_6/N_2$-based etching gas is preferably set to be lower than the $C_4F_6/N_2$ flow rate ratio at which the etching rate of the SiO film is, for example, 50% of a peak value of the $C_4F_6$ flow rate ratio dependency. In this case, when the first hard mask 44 including a SiO film is etched using as a mask the second hard mask 46 including a SiN film, deterioration due to tapering of the patterned shape of the first hard mask 44 may be reduced if not prevented.

As described above, the $C_4F_6/N_2$ flow rate ratio of the $C_4F_6/N_2$-based etching gas is preferably set within the above-described range. When using $C_4F_6/N_2/Ar$ depicted as FIG. 7, the first hard mask 44 is etched at a $C_4F_6$ flow rate x which is preferably set in the range depicted by the arrow A.

Next, the results of estimation of the etching amount of the barrier film 40 including a SiC film when using the $C_4F_6/N_2$-based etching gas and when using the $C_4F_6/O_2$-based etching gas are described.

With respect to the optimum etching selection ratio obtained using the $C_4F_6/N_2$-based etching gas, the SiO/SiN selection ratio is preferably 11, the SiC/SiN selection ratio is preferably 3.5, and the etching selection ratio (SiC/SiO selection ratio) of the SiC film to the SiO film is preferably 0.32.

On the other hand, with respect to the optimum etching selection ratio obtained using the $C_4F_6/O_2$-based etching gas, the SiO/SiN selection ratio is preferably 6, the SiC/SiN selection ratio is preferably 1, and the SiC/SiO selection ratio is preferably 0.17.

When the first hard mask 44 including a SiO film having a thickness of 50 nm is etched under conditions in which the preferable etching selection ratio is attained, the etching amount of the barrier film 40 including a SiC film having an initial thickness of 30 nm and disposed at the bottom of the via hole 52 is as follows: when using the $C_4F_6/N_2$-based etching gas, the etching amount of the barrier film 40 including a SiC film is approximately 16.0 nm, while in the case of the $C_4F_6/O_2$-based etching gas, the etching amount of the barrier film 40 is approximately 8.5 nm. The etching amount of the barrier film 40 using the $C_4F_6/N_2$-based etching gas is about 2 times as large as when the $C_4F_6/O_2$-based etching gas is used.

Therefore, when the $C_4F_6/N_2$-based etching gas is used, the etching amount of the barrier film 40 at the via hole 52, which is etched at the same time as etching of the first hard mask 44, may be increased. Thus, in the subsequent etching for forming the wiring trench 60 in the low-dielectric film 42, the barrier film 40 at the via hole 52 may be removed, thereby preventing the occurrence of an open defect.

When the second hard mask 46 including a SiN film having an initial thickness of 20 nm is used under the above-described conditions, the thickness of the second hard mask 46 including a SiN film after etching of the first hard mask 44 including a SiO film having a thickness of 50 nm is as follows: when using the $C_4F_6/N_2$-based etching gas, the thickness of the remaining second hard mask 46 including a SiN film is approximately 15 nm, while when using the $C_4F_6/O_2$-based etching gas, the thickness is approximately 12 nm.

In addition, Ar may not be included in the $C_4F_6/N_2$-based etching gas used for etching the first hard mask 44 using the second hard mask 46 as a mask. When a $C_4F_6/N_2$-based etching gas not including Ar is used, shoulder rounding of the first hard mask 44 may be further decreased. The reason why shoulder rounding of the first hard mask 44 may be further decreased using the $C_4F_6/N_2$-based etching gas without Ar is that the etching gas does not contain Ar gas which has the property of easy sputter etching of an insulating film.

Further, as described below, the $C_4F_6/N_2$-based etching gas not containing Ar may contain $O_2$ at a specified flow rate ratio or less. That is, $C_4F_6/O_2/N_2$-based etching gas containing $O_2$ at a specified flow rate ratio or less may be used as the $C_4F_6/N_2$-based etching gas.

When the $C_4F_6$-based etching gas is used, etching does not proceed unless carbon (C) present in an etched surface is removed by evaporation. Carbon (C) present in an etched surface includes carbon in the $C_4F_6$ gas and carbon contained in the film to be etched.

When the etching gas contains $O_2$, carbon (C) present in the etched surface reacts with oxygen (O) and evaporates as CO, and thus etching proceeds. When the etching gas contains $N_2$, carbon (C) present in the etched surface reacts with nitrogen (N) and evaporates as CN, and thus etching proceeds. When using the $C_4F_6/O_2$-based etching gas, etching can proceed because C in the etched surface evaporates as CO, while in the case of the $C_4F_6/N_2$-based etching gas, C in the etched surface evaporates as CN.

It has been confirmed by experiments that in order to achieve the same etching amount, the required $N_2$ flow rate is 20 relative to the $O_2$ flow rate of 1 because the reactivity of $N_2$ is lower than that of $O_2$. Therefore, even when part of $N_2$ in the $C_4F_6/N_2$-based etching gas is substituted by $O_2$ at a ratio of 20:1, the etching rate of the SiO film has a peak value of the $C_4F_6$ flow rate dependency.

For example, when using the $C_4F_6/N_2$-based etching gas, part of $N_2$ is substituted by $O_2$ at a ratio of 20:1 when the etching rate of the SiO film is a peak value at the $C_4F_6/N_2$ flow rate ratio of 20/400 in the $C_4F_6$ flow rate dependency. That is, the $C_4F_6/O_2/N_2$ flow rate ratio is 20/1/380, 20/2/360, 20/3/340, ..., 20/10/200, .... Even at a $C_4F_6/O_2/N_2$ flow rate ratio in which part of $N_2$ is substituted by $O_2$ at a ratio of 20:1, the etching rate of the SiO film has a peak value. The etching rate of the SiO film increases as the $O_2$ flow rate increases.

Therefore, the etching rate of the SiO film used as the first hard mask 44 may be increased using the $C_4F_6/O_2/N_2$-based etching gas.

However, as the $O_2$ flow rate ratio in the $C_4F_6/O_2/N_2$-based etching gas increases, the SiC/SiN selection ratio becomes a value closer to that when the $C_4F_6/O_2$-based etching gas is used. As a result, it is difficult to increase the SiC/SiN selection ratio while maintaining the high SiO/SiN selection ratio. Consequently, when the first hard mask 44 composed of a SiO film is etched using the second hard mask 46 composed of a SiN film as a mask, it is difficult to partially etch off the barrier film 40 including a SiC film at the bottom of the via hole 52. Therefore, the $O_2$ flow rate ratio in the $C_4F_6/O_2/N_2$-based etching gas is preferably set to be lower than a specified value which will be described below.

Figure 8:
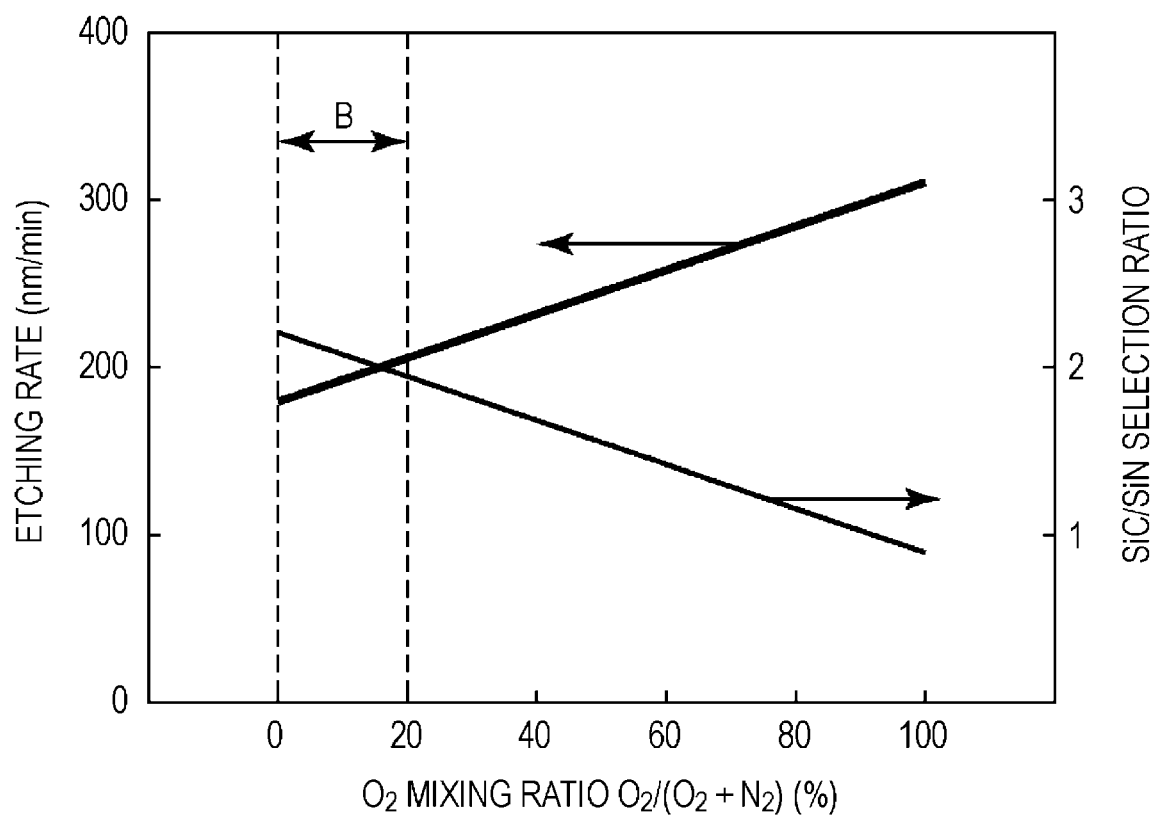
FIG. 8 is a graph depicting a relationship between the ratio of $O_2$ flow rate to the total flow rate of $O_2$ and $N_2$ in a $C_4F_6/O_2/N_2$ etching gas, the etching rate of a SiO film, and the etching selection ratio of a SiC film to a SiN film.

FIG. 8 is a graph depicting a relationship between the ratio of an $O_2$ flow rate ($O_2$ mixing ratio, $O_2/(O_2+N_2)$) to the total flow rate of $O_2$ and $N_2$ in a $C_4F_6/O_2/N_2$-based etching gas, the etching rate of the SiO film, and the SiC/SiN etching selection ratio. In FIG. 8, the $O_2$ mixing ratio is depicted on the abscissa axis, the etching rate of a SiO film is depicted on the left ordinate axis, and the SiC/SiN selection ratio is depicted on the right ordinate axis. In the graph, the etching rate is depicted by a thick line, and the SiC/SiN selection ratio is depicted by a thin line.

The graph in FIG. 8 indicates that the $O_2$ mixing ratio is preferably set to 20% or less where the SiC/SiN selection ratio of about 2 or more may be obtained. Therefore, when the $C_4F_6/O_2/N_2$-based etching gas is used, the $O_2$ mixing ratio is appropriately set within the range of over 0% to 20% depicted by the arrow B in FIG. 8. When the $O_2$ flow rate ratio in the $C_4F_6/O_2/N_2$-based etching gas is set as described above, a high SiC/SiN selection ratio may be obtained, and the etching rate of the SiO film may be further increased.

Next, the reason for using the $CHF_3$-based etching gas in the etching process of etching the low-dielectric film 42 including a SiOC film using the first hard mask 44 including a SiO film as a mask is described in detail below.

Figure 9:
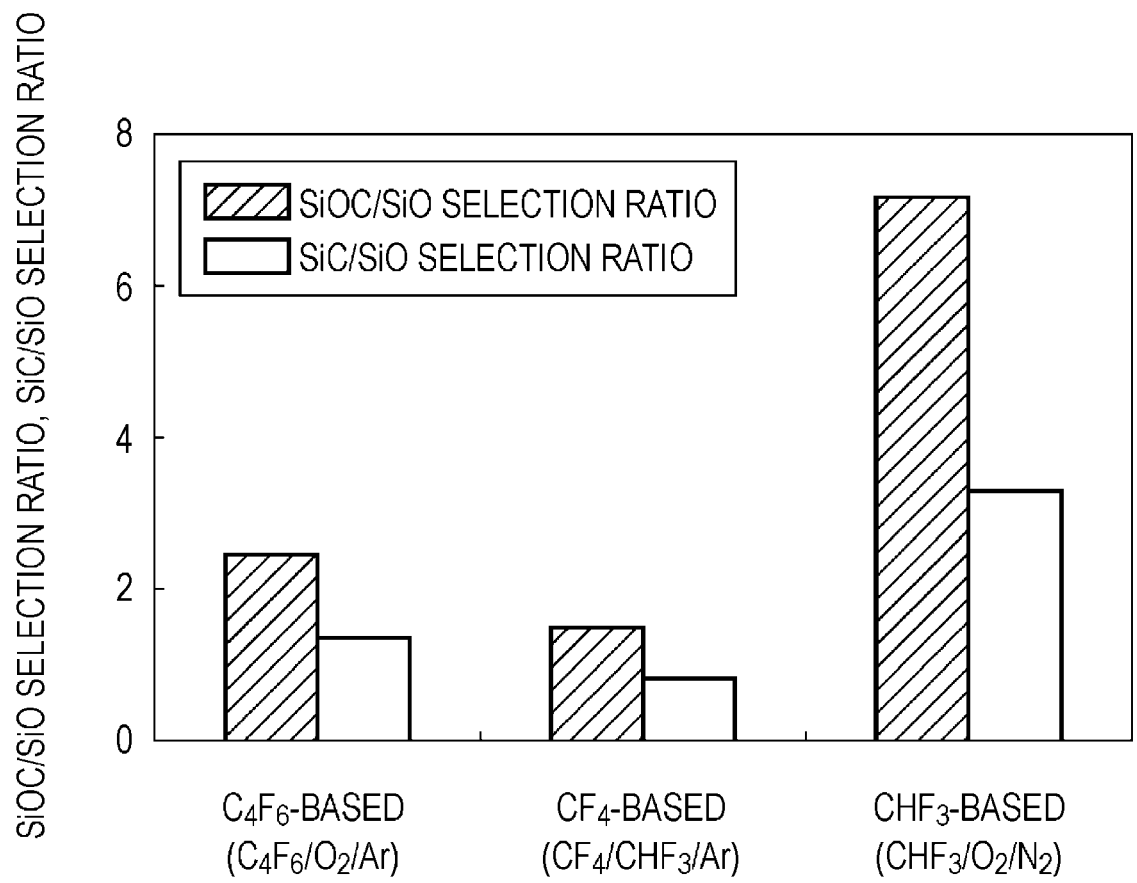
FIG. 9 is a graph depicting the etching selection ratios of a SiOC film to a SiO film and the etching selection ratios of a SiC film to a SiO film when various etching gases are used.

FIG. 9 is a graph depicting the etching selection ratios (SiOC/SiO selection ratio) of a SiOC film to a SiO film and the etching selection ratios (SiC/SiO selection ratio) of a SiC film to a SiO film when using $C_4F_6$-based, $CF_4$-based, and $CHF_3$-based etching gases. $C_4F_6/O_2/Ar$ gas is used as the $C_4F_6$-based etching gas, $CF_4/CHF_3/Ar$ gas is used as the $CF_4$-based etching gas, and $CHF_3/O_2/N_2$ gas used as the $CHF_3$-based etching gas. The SiOC/SiO selection ratio and the SiC/SiO selection ratio represent the maximum values obtained using each of the etching gases.

The low-dielectric film 42 composed of a SiOC film is etched using the first hard mask 44 composed of a SiO film as a mask. The etching gas used in the etching preferably allows the achievement of a high SiOC/SiO selection ratio.

The first hard mask 44 composed of a SiO film is relatively thin and has a thickness of, for example, 60 nm or less, or more preferably 50 nm or less. The reason for this is as follows: the first hard mask 44 is polished as a CMP sacrificial film as depicted in FIG. 1N. When the first hard mask 44 is relatively thick and has a thickness of over 50 nm, or over 60 nm, distribution occurs within the plane of the substrate within the thickness of the first hard mask 44. As a result, the barrier metal 62 and the Cu film 64 on the first hard mask 44 may remain without being polished by the CMP method. From this viewpoint, the thickness of the first hard mask 44 is preferably set to, for example, 60 nm or less, or more preferably 50 nm or less.

The lower limit of the first hard mask 44 depends on the depth of the wiring trench 60 to be formed, but the thickness of the first hard mask 44 is preferably set to, for example, 30 nm or more.

When the relatively thin first hard mask 44 is used, a high SiOC/SiO selection ratio is preferred.

FIG. 9 indicates that in the case of the $CHF_3$-based etching gas, both the SiOC/SiO selection ratio and the SiC/SiO selection ratio are high compared with the other etching gases.

Therefore, in this embodiment, the $CHF_3$-based etching gas is used for etching the low-dielectric film 42 including a SiOC film using the first hard mask 44 including a SiO film as a mask. Consequently, when the low-dielectric film 42 is etched, the wiring trench 60 may be formed, and at the same time, the barrier film 40 including a SiC film at the bottom of the contact hole 52 may be etched off.

Further, when the first hard mask 44 is etched, the barrier film 40 at the bottom of the contact hole 52 is partially removed. Therefore, the wiring trench 60 may be formed to a design depth without being excessively dug, and the barrier film 40 at the bottom of the contact hole 52 may be removed.

As the $CHF_3$-based etching gas, for example, $CHF_3/O_2/N_2$ gas is used. In this case, the etching conditions preferably include a $CHF_3/O_2/N_2$ flow rate ratio of 150/15/200 sccm, a processing chamber pressure of 100 mtorr, and a bias power of 100 W.

In the $CHF_3$-based etching gas containing $O_2$, when the ratio ($CHF_3/O_2$ flow rate ratio) of $CHF_3$ flow rate to $O_2$ flow rate is set to a lower value, the SiOC/SiO selection ratio may be increased. However, when the $CHF_3/O_2$ flow rate ratio is excessively low, the patterned shape of the low-dielectric film 42 deteriorates due to bowing. Therefore, the $CHF_3/O_2$ flow rate ratio is preferably set to a low value, for example 3 to 15, so that the patterned shape of the low-dielectric film 42 is not a bowing shape.

In addition, with a high bias power, shoulder rounding occurs in the first hard mask 44. Therefore, the bias power is preferably decreased as much as possible and is set to, for example, 100 to 500 W.

Further, when the processing chamber pressure is excessively low, the bottom of the wiring trench formed in the low-dielectric film 42 may become rough. Therefore, the processing chamber pressure is preferably set to such a low value, for example, 50 to 200 mtorr, that the wiring trench formed in the low-dielectric film 42 does not become rough.

Therefore, in this embodiment, the $C_4F_6/N_2$-based etching gas is used for etching the first hard mask 44 including a SiO film using the second hard mask 46 including a SiN film as a mask, so that the barrier film 40 including a SiC film at the bottom of the contact hole 52 is partially removed. Therefore, in subsequent etching for forming the wiring trench 60 in the low-dielectric film 42, the wiring trench 60 may be formed to a design depth, and the barrier film 40 at the bottom of the contact hole 52 may be removed. Thus, in this embodiment, a wiring layer may be formed according to design without the occurrence of an open defect.

Modified Embodiment

The present invention is not limited to the above-described embodiment, and various modifications may be made.

Although, in the embodiment, using $C_4F_6/N_2$-based etching gas for etching the first hard mask 44 using the second hard mask 46 as a mask is described, a fluorocarbon such as $C_5F_8$, $C_4F_8$, or the like having similar properties to those of $C_4F_6$ may be used in place of $C_4F_6$.

Although, in the embodiment, using $CHF_3$-based etching gas for etching the low-dielectric film 42 using the first hard mask 44 as a mask is described, another $CH_xF_y$ having similar properties to those of $CHF_3$, for example, a fluorocarbon such as $CH_2F_2$, $CH_3F$, or the like, may be used in place of $CHF_3$.

Although, in the embodiment, using a SiN film as the second hard mask 46 is described, the second hard mask 46 may include a SiN-based material film. For example, a SiN film containing hydrogen (H) may be used as the second hard mask 46.

Although, in the embodiment, using a SiC film as the barrier film 40 is described, the barrier film 40 may include a SiC-based material insulating film. For example, a SiC film containing H, O, or N may be used as the barrier film 40.

Although, in the embodiment, using a SiOC film as the low-dielectric film 42 is described, the low-dielectric film 42 may include a SiOC-based material insulating film. For example, a SiOC film containing H may be used as the low-dielectric film 42.

According to the disclosed method for manufacturing the semiconductor device, when the first mask is etched using the second mask as a mask, the barrier film at the bottom of the contact hole is partially removed. Therefore, in subsequent etching for forming the wiring trench, the wiring trench may be formed to a design depth, and the barrier film at the bottom of the contact hole may be removed. Thus, a wiring layer may be formed according to design without the occurrence of an open defect.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a semiconductor device comprising:
    forming in order a barrier film (40), an insulating film (42), a first mask (44), and a second mask (46) having etching properties different from those of the first mask above a substrate;
    removing the insulating film, the first mask, and the second mask to form a via hole (52) reaching the barrier film;
    after the forming of the via hole, removing the second mask in a wiring trench forming region including the via hole;
    etching the first mask using the second mask as a mask to remove the first mask in the wiring trench forming region, while a part of the barrier film at the bottom of the via hole is etched and another part of the barrier film at the bottom of the via hole is remained, and
    after the removing of the first mask in the wiring trench forming region, etching the insulating film using the first mask as a mask to form a wiring trench (60) in the insulating film while removing the barrier film remained at the bottom of the via hole.

2. The method for manufacturing a semiconductor device according to claim 1,
    wherein, when removing the first mask in the wiring trench forming region, the barrier film at the bottom of the via hole is etched under an etching condition in which the etching selection ratio of the barrier film to the second mask is 2 or more.

3. The method for manufacturing a semiconductor device according to claim 1,
    wherein the barrier film includes a SiC-based material film;
    the first mask includes a silicon oxide film;
    the second mask includes a SiN-based material film; and when removing the first mask in the wiring trench forming region, the first mask is etched using a first etching gas including a first fluorocarbon that is one of $C_4F_6$, $C_5F_8$, or $C_4F_8$, and $N_2$.

4. The method for manufacturing a semiconductor device according to claim 3, wherein the thickness of the first mask is 30 nm to 60 nm.

5. The method for manufacturing a semiconductor device according to claim 3, wherein the thickness of the second mask is 15 nm to 30 nm.

6. The method for manufacturing a semiconductor device according to claim 3, wherein, when removing the first mask in the wiring trench forming region, the flow rate ratio of the first fluorocarbon versus the flow rate ratio of $N_2$ in the first etching gas is set to be equal to or higher than the flow rate ratio at which an etching rate of the first mask is a peak value of the dependency of the etching rate on the flow rate ratio, and equal to or lower than the flow rate ratio at which the etching rate is 50% of the peak value.

7. The method for manufacturing a semiconductor device according to claim 3, wherein the first etching gas further includes $O_2$.

8. The method for manufacturing a semiconductor device according to claim 7, wherein the flow rate ratio of $O_2$ to the total flow rate of $O_2$ and $N_2$ in the first etching gas is 20% or less.

9. The method for manufacturing a semiconductor device according to claim 1, wherein the insulating film includes a SiOC-based material insulating film; and
when forming the wiring trench, the insulating film is etched using a second etching gas including a second fluorocarbon that is one of $CHF_3$, $CH_2F_2$, or $CH_3F$.

10. The method for manufacturing a semiconductor device according to claim 9, wherein the second etching gas further includes $O_2$.

11. The method for manufacturing a semiconductor device according to claim 9, wherein the second etching gas further includes $N_2$.

12. The method for manufacturing a semiconductor device according to claim 1, further comprising:
after forming the wiring trench, burying a wiring layer in the via hole and the wiring trench.

* * * * *